(12) United States Patent
Duong et al.

(10) Patent No.: US 8,087,960 B2
(45) Date of Patent: *Jan. 3, 2012

(54) LED SYSTEM AND METHOD

(75) Inventors: Dung T. Duong, Cedar Park, TX (US);
Paul N. Winberg, Rollingwood, TX (US); Matthew R. Thomas, Austin, TX (US); Elliot M. Pickering, Austin, TX (US)

(73) Assignee: Illumitex, Inc., Austin, TX (US)

( * ) Notice: Subject to any disclaimer, the term of this patent is extended or adjusted under 35 U.S.C. 154(b) by 543 days.

This patent is subject to a terminal disclaimer.

(21) Appl. No.: 11/906,219

(22) Filed: Oct. 1, 2007

(65) Prior Publication Data

US 2008/0081531 A1 Apr. 3, 2008

Related U.S. Application Data

(60) Provisional application No. 60/827,818, filed on Oct. 2, 2006, provisional application No. 60/881,785, filed on Jan. 22, 2007.

(51) Int. Cl.
*F23Q 23/08* (2006.01)
(52) U.S. Cl. ............... 445/3; 257/79; 438/745
(58) Field of Classification Search ............ 216/24; 257/79, 98; 362/84; 359/603; 438/745; 451/36; 445/3
See application file for complete search history.

(56) References Cited

U.S. PATENT DOCUMENTS

| | | |
|---|---|---|
| 1,670,837 A | 5/1828 | Blackmore |
| 3,981,023 A | 9/1976 | King |
| 3,988,633 A | 10/1976 | Shurgan et al. |
| 4,125,890 A | 11/1978 | Nixon, Jr. |
| 4,180,755 A | 12/1979 | Nixon, Jr. |
| 4,239,369 A | 12/1980 | English et al. |
| 4,304,479 A | 12/1981 | Van Allen |
| 4,388,633 A | 6/1983 | Vasudev |

(Continued)

FOREIGN PATENT DOCUMENTS

CN 101385145 A 3/2009

(Continued)

OTHER PUBLICATIONS

The Asymmetric Reflector, Elliptipar, West Haven, CT, 2 pages, downloaded from http://www.elliptipar.com/reflector.asp on Mar. 27, 2009.

(Continued)

*Primary Examiner* — Nimeshkumar Patel
*Assistant Examiner* — Mary Ellen Bowman
(74) *Attorney, Agent, or Firm* — Sprinkle IP Law Group

(57) ABSTRACT

Embodiments provide an LED comprising a quantum well region operable to generate light and a substrate having an interface with the quantum well region, wherein light generated by the quantum well region traverses the interface to enter the substrate and exit the LED through an exit face of the substrate. The exit face may be opposite from and a distance from the interface, with some portion or all of this LED being shaped to optimize the light extraction efficiency of the device. The exit face can have at least 70% of a minimum area necessary to conserve brightness for a desired half-angle of light. Sidewalls of the LED may be positioned and shaped so that rays incident on a sidewall reflect to the exit face with an angle of incidence at the exit face at less than or equal to a critical angle at the exit face.

25 Claims, 17 Drawing Sheets

U.S. PATENT DOCUMENTS

| | | | |
|---|---|---|---|
| 4,439,910 A | 4/1984 | Vasudev |
| 4,486,364 A | 12/1984 | Takahashi |
| 4,501,637 A | 2/1985 | Mitchell et al. |
| 4,716,507 A | 12/1987 | Ames |
| 4,728,999 A | 3/1988 | Dannatt et al. |
| 4,740,259 A | 4/1988 | Heinen |
| 4,799,136 A | 1/1989 | Molnar |
| 4,841,344 A | 6/1989 | Heinen |
| 4,966,862 A | 10/1990 | Edmond |
| 5,036,339 A | 7/1991 | Hediger |
| 5,087,949 A | 2/1992 | Haitz |
| 5,114,513 A | 5/1992 | Hosokawa |
| 5,126,929 A | 6/1992 | Cheselke |
| 5,151,718 A | 9/1992 | Nelson |
| 5,174,649 A | 12/1992 | Alston |
| 5,218,216 A | 6/1993 | Manabe et al. |
| 5,233,204 A | 8/1993 | Fletcher et al. |
| 5,251,117 A | 10/1993 | Nagai |
| 5,272,108 A | 12/1993 | Kozawa et al. |
| 5,278,433 A | 1/1994 | Manabe et al. |
| 5,281,830 A | 1/1994 | Kotaki et al. |
| 5,315,490 A | 5/1994 | Bastable |
| 5,369,289 A | 11/1994 | Tamaki et al. |
| 5,523,591 A | 6/1996 | Fleming et al. |
| 5,528,720 A | 6/1996 | Winston |
| 5,563,422 A | 10/1996 | Nakamura et al. |
| 5,578,156 A | 11/1996 | Kamakura et al. |
| 5,587,593 A | 12/1996 | Koide et al. |
| 5,620,557 A | 4/1997 | Manabe et al. |
| 5,652,438 A | 7/1997 | Sassa et al. |
| 5,654,831 A | 8/1997 | Byren et al. |
| 5,667,297 A | 9/1997 | Maassen |
| 5,700,713 A | 12/1997 | Yamakazi et al. |
| 5,739,554 A | 4/1998 | Edmond et al. |
| 5,780,867 A | 7/1998 | Fritz et al. |
| 5,790,583 A | 8/1998 | Ho |
| 5,813,753 A | 9/1998 | Vriens et al. |
| 5,839,424 A | 11/1998 | Hauser |
| 5,846,844 A | 12/1998 | Akasaki et al. |
| 5,862,167 A | 1/1999 | Sassa et al. |
| 5,912,477 A | 6/1999 | Negley |
| 5,945,689 A | 8/1999 | Koike et al. |
| 5,953,469 A | 9/1999 | Zhou |
| 5,959,401 A | 9/1999 | Asami et al. |
| 5,998,925 A | 12/1999 | Shimizu et al. |
| 6,005,722 A | 12/1999 | Butterworth et al. |
| 6,008,539 A | 12/1999 | Shibata et al. |
| 6,023,076 A | 2/2000 | Shibata |
| 6,066,861 A | 5/2000 | Hohn et al. |
| 6,078,064 A | 6/2000 | Ming-Jiunn et al. |
| 6,093,941 A | 7/2000 | Russell |
| 6,118,908 A | 9/2000 | Bischel |
| 6,133,589 A | 10/2000 | Krames |
| 6,144,536 A | 11/2000 | Zimmerman |
| 6,169,294 B1 | 1/2001 | Biing-Jye et al. |
| 6,177,761 B1 | 1/2001 | Pelka et al. |
| 6,185,051 B1 | 2/2001 | Chen et al. |
| 6,194,742 B1 | 2/2001 | Kern et al. |
| 6,201,262 B1 | 3/2001 | Edmond et al. |
| 6,221,683 B1 | 4/2001 | Nirsche et al. |
| 6,222,207 B1 | 4/2001 | Carter-Coman et al. |
| 6,229,160 B1 | 5/2001 | Krames |
| 6,229,782 B1 | 5/2001 | Wang et al. |
| 6,257,737 B1 | 7/2001 | Marshall et al. |
| 6,258,618 B1 | 7/2001 | Lester |
| 6,271,622 B1 | 8/2001 | Coushaine et al. |
| 6,274,924 B1 | 8/2001 | Carey et al. |
| 6,287,947 B1 | 9/2001 | Ludowise et al. |
| 6,307,218 B1 | 10/2001 | Steigerwald et al. |
| 6,310,364 B1 | 10/2001 | Uemura |
| 6,323,063 B2 | 11/2001 | Krames |
| 6,331,450 B1 | 12/2001 | Uemura |
| 6,335,999 B1 | 1/2002 | Winston |
| 6,337,493 B1 | 1/2002 | Tanizawa et al. |
| D453,745 S | 2/2002 | Suenaga |
| 6,350,041 B1 | 2/2002 | Tarsa et al. |
| 6,351,069 B1 | 2/2002 | Lowery et al. |
| 6,356,700 B1 | 3/2002 | Strobl |
| 6,361,192 B1 | 3/2002 | Fussell et al. |
| 6,364,487 B1 | 4/2002 | Weber et al. |
| 6,377,535 B1 | 4/2002 | Chen et al. |
| 6,410,942 B1 | 6/2002 | Thibeault |
| 6,417,019 B1 | 7/2002 | Mueller et al. |
| 6,443,594 B1 | 9/2002 | Marshall et al. |
| 6,445,011 B1 | 9/2002 | Hirano et al. |
| 6,452,214 B2 | 9/2002 | Kaneyama et al. |
| 6,459,100 B1 | 10/2002 | Doverspike et al. |
| 6,478,453 B2 | 11/2002 | Lammers et al. |
| 6,486,499 B1 | 11/2002 | Krames et al. |
| 6,489,636 B1 | 12/2002 | Goetz et al. |
| 6,501,102 B2 | 12/2002 | Mueller-Mach et al. |
| 6,502,956 B1 | 1/2003 | Wu |
| 6,504,171 B1 | 1/2003 | Grillot et al. |
| 6,504,179 B1 | 1/2003 | Ellens et al. |
| 6,514,782 B1 | 2/2003 | Wierer, Jr. et al. |
| 6,515,313 B1 | 2/2003 | Ibbetson et al. |
| 6,526,082 B1 | 2/2003 | Corzine et al. |
| 6,526,201 B1 | 2/2003 | Mrakovich et al. |
| 6,527,411 B1 | 3/2003 | Sayers |
| 6,534,797 B1 | 3/2003 | Edmond et al. |
| 6,541,800 B2 | 4/2003 | Barnett et al. |
| 6,547,416 B2 | 4/2003 | Pashley et al. |
| 6,547,423 B2 | 4/2003 | Marshall |
| 6,563,142 B2 | 5/2003 | Shen et al. |
| 6,570,190 B2 | 5/2003 | Krames |
| 6,573,537 B1 | 6/2003 | Steigerwald et al. |
| 6,576,488 B2 | 6/2003 | Collins, III et al. |
| 6,576,932 B2 | 6/2003 | Khare et al. |
| D477,579 S | 7/2003 | Suenaga |
| D477,580 S | 7/2003 | Kamada |
| 6,598,998 B2 | 7/2003 | West |
| D478,877 S | 8/2003 | Hoshiba |
| 6,603,243 B2 | 8/2003 | Parkyn et al. |
| 6,603,258 B1 | 8/2003 | Mueller-Mach et al. |
| 6,608,330 B1 | 8/2003 | Yamada |
| 6,610,598 B2 | 8/2003 | Chen |
| 6,620,643 B1 | 9/2003 | Koike et al. |
| 6,623,142 B1 | 9/2003 | Lippmann et al. |
| 6,630,689 B2 | 10/2003 | Bhat et al. |
| 6,630,691 B1 | 10/2003 | Mueller-Mach et al. |
| 6,630,692 B2 | 10/2003 | Goetz et al. |
| 6,635,503 B2 | 10/2003 | Andrews et al. |
| 6,635,904 B2 | 10/2003 | Goetz et al. |
| 6,637,921 B2 | 10/2003 | Coushaine |
| 6,639,733 B2 | 10/2003 | Minano |
| D482,337 S | 11/2003 | Kamada |
| D482,666 S | 11/2003 | Kamada |
| 6,642,618 B2 | 11/2003 | Yagi et al. |
| 6,642,652 B2 | 11/2003 | Collins, III et al. |
| 6,649,440 B1 | 11/2003 | Krames et al. |
| 6,649,943 B2 | 11/2003 | Shibata et al. |
| 6,649,946 B2 | 11/2003 | Bogner et al. |
| 6,650,044 B1 | 11/2003 | Lowery |
| 6,657,236 B1 | 12/2003 | Thibeault |
| 6,657,300 B2 | 12/2003 | Goetz et al. |
| 6,664,560 B2 | 12/2003 | Emerson et al. |
| 6,671,452 B2 | 12/2003 | Winston |
| 6,679,621 B2 | 1/2004 | West et al. |
| 6,680,490 B2 | 1/2004 | Yasukawa et al. |
| 6,680,569 B2 | 1/2004 | Mueller-Mach et al. |
| 6,682,207 B2 | 1/2004 | Weber et al. |
| 6,682,331 B1 | 1/2004 | Peh |
| 6,683,327 B2 | 1/2004 | Krames et al. |
| 6,686,691 B1 | 2/2004 | Mueller et al. |
| 6,696,703 B2 | 2/2004 | Mueller-Mach et al. |
| 6,711,200 B1 | 3/2004 | Scherer |
| 6,717,353 B1 | 4/2004 | Mueller et al. |
| 6,717,355 B2 | 4/2004 | Takahashi et al. |
| D489,690 S | 5/2004 | Ishida |
| D490,387 S | 5/2004 | Yagi |
| 6,730,939 B2 | 5/2004 | Eisert et al. |
| 6,730,940 B1 | 5/2004 | Steranka |
| 6,734,467 B2 | 5/2004 | Schlereth et al. |
| 6,737,681 B2 | 5/2004 | Koda |
| 6,738,175 B2 | 5/2004 | Morita et al. |
| 6,740,906 B2 | 5/2004 | Slater, Jr. et al. |
| D490,782 S | 6/2004 | Suenaga |

| | | | | | | |
|---|---|---|---|---|---|---|
| D490,784 S | 6/2004 | Ishida | | 6,925,100 B2 | 8/2005 | Senda et al. |
| D491,538 S | 6/2004 | Ishida | | 6,936,859 B1 | 8/2005 | Uemura et al. |
| D491,899 S | 6/2004 | Yagi | | 6,936,860 B2 | 8/2005 | Sung et al. |
| 6,744,071 B2 | 6/2004 | Sano et al. | | 6,943,128 B2 | 9/2005 | Chiyo et al. |
| 6,744,077 B2 | 6/2004 | Trottier et al. | | 6,943,380 B2 | 9/2005 | Ota et al. |
| 6,746,124 B2 | 6/2004 | Fischer et al. | | 6,943,381 B2 | 9/2005 | Gardner et al. |
| 6,746,295 B2 | 6/2004 | Sorg | | 6,943,433 B2 | 9/2005 | Kamada |
| 6,747,298 B2 | 6/2004 | Slater, Jr. et al. | | 6,946,682 B2 | 9/2005 | Slater, Jr. et al. |
| 6,759,803 B2 | 7/2004 | Sorg | | 6,946,685 B1 | 9/2005 | Steigerwald et al. |
| 6,764,932 B2 | 7/2004 | Kong et al. | | D510,913 S | 10/2005 | Sumitani |
| 6,768,136 B2 | 7/2004 | Eisert et al. | | 6,952,024 B2 | 10/2005 | Edmond et al. |
| 6,768,525 B2 | 7/2004 | Paolini | | 6,953,952 B2 | 10/2005 | Asakawa |
| 6,774,405 B2 | 8/2004 | Yasukawa et al. | | 6,955,933 B2 | 10/2005 | Bour et al. |
| 6,777,871 B2 | 8/2004 | Duggal | | 6,956,245 B2 | 10/2005 | Senda et al. |
| 6,784,027 B2 | 8/2004 | Streubel et al. | | 6,956,247 B1 | 10/2005 | Stockman |
| D495,822 S | 9/2004 | Yoneda | | 6,958,497 B2 | 10/2005 | Emerson et al. |
| D496,007 S | 9/2004 | Hoshiba | | 6,960,878 B2 | 11/2005 | Sakano et al. |
| 6,791,103 B2 | 9/2004 | Nakamura et al. | | 6,967,116 B2 | 11/2005 | Negley |
| 6,791,116 B2 | 9/2004 | Takahashi et al. | | 6,969,946 B2 | 11/2005 | Steranka |
| 6,791,119 B2 | 9/2004 | Slater | | 6,972,438 B2 | 12/2005 | Li |
| 6,794,211 B2 | 9/2004 | Oh | | 6,977,396 B2 | 12/2005 | Shen et al. |
| 6,794,684 B2 | 9/2004 | Slater, Jr. et al. | | 6,987,281 B2 | 1/2006 | Edmond et al. |
| 6,794,690 B2 | 9/2004 | Uemura | | 6,987,287 B2 | 1/2006 | Liu et al. |
| D497,349 S | 10/2004 | Hoshiba | | 6,987,613 B2 | 1/2006 | Pocius |
| 6,800,500 B2 | 10/2004 | Coman | | 6,989,555 B2 | 1/2006 | Goetz et al. |
| 6,800,876 B2 | 10/2004 | Edmond et al. | | 6,992,334 B1 | 1/2006 | Wierer, Jr. et al. |
| 6,806,571 B2 | 10/2004 | Shibata et al. | | 6,993,242 B2 | 1/2006 | Winston |
| 6,812,053 B1 | 11/2004 | Kong et al. | | 6,995,032 B2 | 2/2006 | Bruhns et al. |
| 6,812,500 B2 | 11/2004 | Reeh et al. | | 6,998,771 B2 | 2/2006 | Debray et al. |
| 6,814,470 B2 | 11/2004 | Rizkin et al. | | 7,001,058 B2 | 2/2006 | Inditsky |
| 6,819,505 B1 | 11/2004 | Cassarly | | 7,002,291 B2 | 2/2006 | Ellens et al. |
| 6,819,506 B1 | 11/2004 | Taylor | | 7,005,679 B2 | 2/2006 | Tarsa et al. |
| 6,821,804 B2 | 11/2004 | Thibeault et al. | | 7,005,681 B2 | 2/2006 | Bader et al. |
| 6,825,501 B2 | 11/2004 | Edmond et al. | | 7,005,684 B2 | 2/2006 | Uemura et al. |
| D499,384 S | 12/2004 | Kamada | | 7,009,008 B1 | 3/2006 | Hohn et al. |
| D499,385 S | 12/2004 | Ishida | | 7,009,199 B2 | 3/2006 | Hall |
| 6,828,596 B2 | 12/2004 | Steigerwald et al. | | 7,009,213 B2 | 3/2006 | Camras |
| 6,828,599 B2 | 12/2004 | Kim | | 7,009,218 B2 | 3/2006 | Sugimoto et al. |
| 6,831,302 B2 | 12/2004 | Erchak | | 7,012,279 B2 | 3/2006 | Wierer, Jr. et al. |
| 6,831,305 B2 | 12/2004 | Yasukawa et al. | | 7,012,281 B2 | 3/2006 | Tsai et al. |
| 6,833,564 B2 | 12/2004 | Shen et al. | | 7,015,054 B2 | 3/2006 | Steigerwald et al. |
| 6,835,957 B2 | 12/2004 | Stockman | | 7,015,513 B2 | 3/2006 | Hsieh |
| 6,838,705 B1 | 1/2005 | Tanizawa et al. | | 7,015,516 B2 | 3/2006 | Eliashevich |
| 6,841,931 B2 | 1/2005 | Takahashi et al. | | 7,018,915 B2 | 3/2006 | Shibata et al. |
| 6,844,565 B2 | 1/2005 | Lell et al. | | 7,021,797 B2 | 4/2006 | Minano |
| 6,844,903 B2 | 1/2005 | Mueller-Mach et al. | | 7,026,653 B2 | 4/2006 | Sun |
| 6,846,101 B2 | 1/2005 | Coushaine | | 7,029,935 B2 | 4/2006 | Negley et al. |
| 6,847,057 B1 | 1/2005 | Gardner et al. | | 7,029,939 B2 | 4/2006 | Chiyo et al. |
| 6,850,002 B2 | 2/2005 | Danielson et al. | | 7,030,423 B2 | 4/2006 | Chang et al. |
| 6,853,010 B2 | 2/2005 | Slater | | 7,037,741 B2 | 5/2006 | Tasi et al. |
| D502,449 S | 3/2005 | Ishida | | 7,038,246 B2 | 5/2006 | Uemura |
| D503,388 S | 3/2005 | Ishida | | 7,038,370 B2 | 5/2006 | Mueller-Mach et al. |
| 6,870,191 B2 | 3/2005 | Niki et al. | | 7,040,774 B2 | 5/2006 | Beeson |
| 6,870,311 B2 | 3/2005 | Mueller et al. | | 7,042,012 B2 | 5/2006 | Senda et al. |
| 6,871,982 B2 | 3/2005 | Holman | | 7,042,153 B2 | 5/2006 | Uemura |
| 6,872,986 B2 | 3/2005 | Fukuda et al. | | 7,045,956 B2 | 5/2006 | Braune et al. |
| 6,876,008 B2 | 4/2005 | Bhat et al. | | 7,053,417 B2 | 5/2006 | Kim |
| 6,876,009 B2 | 4/2005 | Narukawa et al. | | 7,053,419 B1 | 5/2006 | Camras |
| 6,877,558 B2 | 4/2005 | Connell et al. | | 7,063,807 B2 | 6/2006 | Kummer et al. |
| 6,878,973 B2 | 4/2005 | Lowery et al. | | 7,064,353 B2 | 6/2006 | Bhat |
| 6,885,033 B2 | 4/2005 | Andrews | | 7,064,355 B2 | 6/2006 | Camras |
| 6,885,036 B2 | 4/2005 | Tarsa | | 7,064,480 B2 | 6/2006 | Bokor et al. |
| 6,888,997 B2 | 5/2005 | Duong | | 7,070,300 B2 | 7/2006 | Harbers et al. |
| 6,890,085 B2 | 5/2005 | Hacker | | 7,071,494 B2 | 7/2006 | Steigerwald |
| 6,891,199 B2 | 5/2005 | Baur et al. | | 7,071,495 B2 | 7/2006 | Uemura |
| 6,896,381 B2 | 5/2005 | Benitez | | 7,072,096 B2 | 7/2006 | Holman |
| 6,897,488 B2 | 5/2005 | Baur et al. | | 7,074,631 B2 | 7/2006 | Erchak |
| 6,897,490 B2 | 5/2005 | Brunner et al. | | 7,075,610 B2 | 7/2006 | Scalora |
| 6,900,472 B2 | 5/2005 | Kondoh et al. | | 7,078,254 B2 | 7/2006 | Loh |
| 6,900,474 B2 | 5/2005 | Misra et al. | | 7,078,732 B1 | 7/2006 | Reeh et al. |
| D506,449 S | 6/2005 | Hoshiba | | 7,078,738 B2 | 7/2006 | Nawashiro et al. |
| 6,903,376 B2 | 6/2005 | Shen et al. | | 7,080,932 B2 | 7/2006 | Keuper |
| 6,906,352 B2 | 6/2005 | Edmond et al. | | 7,083,993 B2 | 8/2006 | Erchak |
| 6,911,676 B2 | 6/2005 | Yoo | | 7,087,738 B2 | 8/2006 | Botstein et al. |
| 6,916,748 B2 | 7/2005 | Huang | | 7,087,931 B2 | 8/2006 | Wu et al. |
| 6,917,059 B2 | 7/2005 | Uemura | | 7,087,936 B2 | 8/2006 | Negley |
| 6,921,928 B2 | 7/2005 | Sonobe | | 7,091,656 B2 | 8/2006 | Murazaki et al. |
| 6,924,514 B2 | 8/2005 | Suenaga | | 7,095,765 B2 | 8/2006 | Liu et al. |
| 6,924,596 B2 | 8/2005 | Sato et al. | | 7,098,588 B2 | 8/2006 | Jager et al. |

| Patent No. | Date | Name |
|---|---|---|
| 7,105,857 B2 | 9/2006 | Nagahama et al. |
| 7,106,090 B2 | 9/2006 | Harle et al. |
| 7,108,386 B2 | 9/2006 | Jacobson |
| 7,109,521 B2 | 9/2006 | Hallin |
| 7,109,529 B2 | 9/2006 | Uemura et al. |
| 7,111,964 B2 | 9/2006 | Suehiro et al. |
| 7,112,636 B2 | 9/2006 | Okada |
| 7,122,839 B2 | 10/2006 | Shen et al. |
| 7,132,695 B2 | 11/2006 | Ou et al. |
| 7,132,786 B1 | 11/2006 | Debray et al. |
| 7,138,662 B2 | 11/2006 | Uemura |
| 7,153,015 B2 | 12/2006 | Brukilacchio |
| 7,154,121 B2 | 12/2006 | Hsieh et al. |
| 7,154,149 B2 | 12/2006 | Wu et al. |
| D534,505 S | 1/2007 | Kamada |
| 7,157,294 B2 | 1/2007 | Uemura et al. |
| 7,161,187 B2 | 1/2007 | Suehiro et al. |
| 7,161,301 B2 | 1/2007 | Hsieh et al. |
| 7,170,097 B2 | 1/2007 | Edmond et al. |
| D536,672 S | 2/2007 | Asakawa |
| D537,047 S | 2/2007 | Asakawa |
| 7,183,586 B2 | 2/2007 | Ichihara et al. |
| 7,183,632 B2 | 2/2007 | Arndt et al. |
| 7,183,661 B2 | 2/2007 | Bogner et al. |
| 7,192,797 B2 | 3/2007 | Tu et al. |
| 7,193,299 B2 | 3/2007 | Arndt et al. |
| 7,196,359 B2 | 3/2007 | Baur et al. |
| 7,201,495 B2 | 4/2007 | Epstein |
| 7,202,181 B2 * | 4/2007 | Negley ............ 438/745 |
| 7,211,832 B2 | 5/2007 | Hirose |
| 7,211,833 B2 | 5/2007 | Slater, Jr. et al. |
| 7,211,835 B2 | 5/2007 | Ono |
| 7,215,074 B2 | 5/2007 | Shimuzu et al. |
| 7,217,583 B2 | 5/2007 | Negley et al. |
| 7,227,190 B2 | 6/2007 | Yasukawa et al. |
| 7,227,191 B2 | 6/2007 | Eberhard et al. |
| D547,736 S | 7/2007 | Kamada |
| 7,244,968 B2 | 7/2007 | Yoo |
| 7,247,257 B2 | 7/2007 | Murazaki et al. |
| 7,247,884 B2 | 7/2007 | Shibata et al. |
| 7,247,940 B2 | 7/2007 | Hofer et al. |
| 7,250,715 B2 | 7/2007 | Mueller et al. |
| 7,253,450 B2 | 8/2007 | Senda et al. |
| 7,253,451 B2 | 8/2007 | Yoo et al. |
| 7,256,428 B2 | 8/2007 | Braune et al. |
| 7,256,468 B2 | 8/2007 | Suenaga |
| 7,256,483 B2 | 8/2007 | Epler et al. |
| 7,258,816 B2 | 8/2007 | Tamaki et al. |
| 7,259,033 B2 | 8/2007 | Slater, Jr. et al. |
| 7,259,402 B2 | 8/2007 | Edmond et al. |
| 7,264,527 B2 | 9/2007 | Bawendi et al. |
| 7,265,392 B2 | 9/2007 | Hahn et al. |
| 7,268,371 B2 | 9/2007 | Krames et al. |
| 7,274,040 B2 | 9/2007 | Sun |
| 7,279,346 B2 | 10/2007 | Andrews et al. |
| 7,279,723 B2 | 10/2007 | Matsumura et al. |
| 7,279,724 B2 | 10/2007 | Collins, III et al. |
| 7,280,288 B2 | 10/2007 | Loh et al. |
| 7,282,744 B2 | 10/2007 | Flynn et al. |
| 7,288,797 B2 | 10/2007 | Deguchi et al. |
| 7,291,529 B2 | 11/2007 | Slater, Jr. et al. |
| 7,291,865 B2 | 11/2007 | Kojima et al. |
| 7,294,866 B2 | 11/2007 | Liu |
| 7,300,175 B2 | 11/2007 | Brukilacchio |
| D557,224 S | 12/2007 | Kamada |
| 7,319,247 B2 | 1/2008 | Bader et al. |
| 7,319,289 B2 | 1/2008 | Suehiro et al. |
| 7,326,583 B2 | 2/2008 | Andrews et al. |
| 7,326,967 B2 | 2/2008 | Hsieh et al. |
| 7,329,587 B2 | 2/2008 | Bruederl et al. |
| 7,329,905 B2 | 2/2008 | Ibbetson et al. |
| 7,332,365 B2 | 2/2008 | Nakamura et al. |
| 7,335,522 B2 | 2/2008 | Wang et al. |
| 7,335,920 B2 | 2/2008 | Denbaars et al. |
| 7,338,822 B2 | 3/2008 | Wu et al. |
| 7,341,878 B2 | 3/2008 | Krames et al. |
| 7,344,902 B2 | 3/2008 | Basin et al. |
| 7,345,297 B2 | 3/2008 | Yamazoe et al. |
| 7,345,313 B2 | 3/2008 | Strauss et al. |
| 7,345,413 B2 | 3/2008 | Braune et al. |
| 7,348,600 B2 | 3/2008 | Narukawa et al. |
| D565,516 S | 4/2008 | Kamada |
| 7,351,356 B2 | 4/2008 | Delsing et al. |
| 7,352,011 B2 | 4/2008 | Smits et al. |
| 7,355,209 B2 | 4/2008 | Tsai et al. |
| 7,355,210 B2 | 4/2008 | Ou et al. |
| 7,355,284 B2 | 4/2008 | Negley |
| 7,358,522 B2 | 4/2008 | Yanamoto |
| 7,358,540 B2 | 4/2008 | Hsieh et al. |
| 7,361,938 B2 | 4/2008 | Mueller et al. |
| 7,362,048 B2 | 4/2008 | Shimizu et al. |
| 7,365,369 B2 | 4/2008 | Nakamura et al. |
| 7,365,371 B2 | 4/2008 | Andrews |
| 7,368,329 B2 | 5/2008 | Waitl et al. |
| 7,372,198 B2 | 5/2008 | Negley |
| 7,375,377 B2 | 5/2008 | Baur et al. |
| D571,738 S | 6/2008 | Wall, Jr. |
| 7,382,033 B2 | 6/2008 | Roth et al. |
| 7,384,809 B2 | 6/2008 | Donofrio |
| 7,385,226 B2 | 6/2008 | Ou et al. |
| 7,387,677 B2 | 6/2008 | Dwilinski et al. |
| 7,388,232 B2 | 6/2008 | Suehiro et al. |
| 7,390,684 B2 | 6/2008 | Izuno et al. |
| D572,209 S | 7/2008 | Tokuda |
| 7,393,122 B2 | 7/2008 | Tsuzuki et al. |
| 7,393,213 B2 | 7/2008 | Yoo et al. |
| 7,402,837 B2 | 7/2008 | Slater, Jr. et al. |
| 7,402,840 B2 | 7/2008 | Krames et al. |
| 7,405,093 B2 | 7/2008 | Andrews |
| 7,414,269 B2 | 8/2008 | Grotsch et al. |
| 7,419,839 B2 | 9/2008 | Camras et al. |
| 7,429,750 B2 | 9/2008 | Suehiro et al. |
| 7,429,758 B2 | 9/2008 | Ruhnau et al. |
| D578,226 S | 10/2008 | West et al. |
| 7,432,534 B2 | 10/2008 | Yoo et al. |
| 7,432,536 B2 | 10/2008 | Slater, Jr. et al. |
| 7,432,589 B2 | 10/2008 | Yamamoto et al. |
| 7,432,642 B2 | 10/2008 | Murazaki |
| 7,432,647 B2 | 10/2008 | Nagatomi et al. |
| 7,436,002 B2 | 10/2008 | Brunner et al. |
| 7,436,066 B2 | 10/2008 | Sonobe et al. |
| 7,439,091 B2 | 10/2008 | Chen et al. |
| 7,439,609 B2 | 10/2008 | Negley |
| 7,442,254 B2 | 10/2008 | Kiyoku et al. |
| 7,442,644 B2 | 10/2008 | Nogami |
| 7,442,966 B2 | 10/2008 | Bader et al. |
| D580,380 S | 11/2008 | Tokuda |
| 7,445,354 B2 | 11/2008 | Aoki et al. |
| 7,446,343 B2 | 11/2008 | Mueller et al. |
| 7,446,344 B2 | 11/2008 | Fehrer et al. |
| 7,446,345 B2 | 11/2008 | Emerson et al. |
| 7,446,346 B2 | 11/2008 | Harle |
| 7,452,737 B2 | 11/2008 | Basin et al. |
| 7,456,499 B2 | 11/2008 | Loh et al. |
| D582,865 S | 12/2008 | Edmond et al. |
| D582,866 S | 12/2008 | Edmond et al. |
| 7,462,861 B2 | 12/2008 | Slater, Jr. et al. |
| 7,473,933 B2 | 1/2009 | Yan |
| 7,772,604 B2 | 8/2010 | Duong et al. |
| 7,789,531 B2 | 9/2010 | Duong et al. |
| 7,829,358 B2 | 11/2010 | Duong et al. |
| 2002/0012247 A1 | 1/2002 | Kamiya et al. |
| 2002/0017844 A1 | 2/2002 | Parkyn et al. |
| 2002/0080615 A1 | 6/2002 | Marshall et al. |
| 2002/0080622 A1 | 6/2002 | Pashley et al. |
| 2002/0123164 A1 | 9/2002 | Slater et al. |
| 2002/0127864 A1 | 9/2002 | Smith et al. |
| 2002/0141006 A1 | 10/2002 | Pocius et al. |
| 2002/0163808 A1 | 11/2002 | West et al. |
| 2003/0002272 A1 | 1/2003 | Suehiro et al. |
| 2003/0036217 A1 | 2/2003 | Richard |
| 2003/0089914 A1 | 5/2003 | Chen |
| 2003/0132447 A1 | 7/2003 | Yukimoto |
| 2003/0156416 A1 | 8/2003 | Stopa et al. |
| 2004/0016718 A1 * | 1/2004 | Hwu et al. ............ 216/24 |
| 2004/0036080 A1 | 2/2004 | Bogner et al. |
| 2004/0046489 A1 | 3/2004 | Vetorino et al. |
| 2004/0079957 A1 | 4/2004 | Andrews et al. |

| | | | |
|---|---|---|---|
| 2004/0114393 | A1 | 6/2004 | Galli |
| 2004/0120153 | A1 | 6/2004 | Pate |
| 2004/0126913 | A1 | 7/2004 | Loh |
| 2004/0155565 | A1 | 8/2004 | Holder et al. |
| 2004/0201987 | A1 | 10/2004 | Omata |
| 2004/0207774 | A1 | 10/2004 | Gothard |
| 2004/0218390 | A1 | 11/2004 | Holman et al. |
| 2004/0222426 | A1 | 11/2004 | Hsiung |
| 2004/0232825 | A1 | 11/2004 | Sorg |
| 2004/0233665 | A1 | 11/2004 | West et al. |
| 2004/0264185 | A1 | 12/2004 | Grotsch et al. |
| 2005/0001230 | A1 | 1/2005 | Takekuma |
| 2005/0006651 | A1 | 1/2005 | LeBoeuf et al. |
| 2005/0007777 | A1 | 1/2005 | Klipstein et al. |
| 2005/0018248 | A1 | 1/2005 | Silverbrook |
| 2005/0024887 | A1 | 2/2005 | Boyler |
| 2005/0047729 | A1 | 3/2005 | Vilgiate |
| 2005/0063181 | A1 | 3/2005 | Chiba et al. |
| 2005/0073840 | A1 | 4/2005 | Chou et al. |
| 2005/0073849 | A1 | 4/2005 | Rhoads et al. |
| 2005/0077529 | A1 | 4/2005 | Shen |
| 2005/0173719 | A1 | 8/2005 | Yonekubo |
| 2005/0195488 | A1* | 9/2005 | McCabe et al. ............... 359/603 |
| 2006/0046622 | A1 | 3/2006 | Prasad |
| 2006/0094340 | A1 | 5/2006 | Ouderkirk et al. |
| 2006/0108590 | A1 | 5/2006 | Kawaguchi |
| 2006/0192194 | A1 | 8/2006 | Erchak et al. |
| 2007/0108459 | A1 | 5/2007 | Lu |
| 2007/0152230 | A1 | 7/2007 | Duong et al. |
| 2008/0030974 | A1 | 2/2008 | Abug-Ageel |
| 2008/0030993 | A1 | 2/2008 | Narendran et al. |
| 2008/0062672 | A1 | 3/2008 | Peng et al. |
| 2008/0080166 | A1 | 4/2008 | Duong et al. |
| 2008/0266893 | A1 | 10/2008 | Speier |
| 2009/0085043 | A1 | 4/2009 | Song et al. |
| 2009/0085052 | A1 | 4/2009 | Ko et al. |
| 2009/0087937 | A1 | 4/2009 | Kim |
| 2009/0087994 | A1 | 4/2009 | Lee et al. |
| 2009/0275266 | A1* | 11/2009 | Winberg et al. ................ 451/36 |

FOREIGN PATENT DOCUMENTS

| | | |
|---|---|---|
| EP | 1 380 469 A2 | 1/2004 |
| JP | 2003-53647 | 2/2003 |
| JP | P3900144 | 1/2007 |
| WO | WO2007061638 | 5/2007 |
| WO | WO 2007081719 A2 | 7/2007 |
| WO | WO 2008042351 A3 | 4/2008 |

OTHER PUBLICATIONS

Sports Lighting Solutions, Lighting Information, Abacus Lighting Limited, Nottinghamshire, England, 3 pages, downloaded from http://www.abacuslighting.com/sportslighting.asp?sport=sn03 on Mar. 27, 2009.

Samsung files patents ahead of LED spin-out, Apr. 2, 2009, downloaded Apr. 14, 2009 at http://compoundsemiconductor.net/cws/article/news/38551, 2 pages.

International Search Report and Written Opinion issued in International Patent Application No. PCT/US07/00102 mailed Mar. 28, 2008.

International Search Report and Written Opinion issued in International Patent Application No. PCT/US07/21117 mailed Mar. 25, 2008.

International Search Report and Written Opinion, PCT/US09/051962, mailed Sep. 15, 2009, 5 pgs.

Office Action issued in U.S. Appl. No. 11/906,194, mailed on Jul. 24, 2009, 7 pgs.

International Search Report and Written Opinion, International Patent Application No. PCT/US09/48788, mailed Aug. 14, 2009, 6 pgs.

International Search Report and Written Opinion, International Patent Application No. PCT/US09/48787, mailed Aug. 19, 2009, 7 pgs.

Office Action issued in U.S. Appl. No. 11/649,018, mailed Sep. 4, 2009, 18 pgs.

International Search Report and Written Opinion issued in PCT/US2009/033429 dated Apr. 15, 2009, Illumitex, Inc., 9 pages.

International Preliminary Report on Patentability and Written Opinion issued in PCT/US2007/021117 dated Apr. 7, 2009, Illumitex, Inc., 8 pages.

International Preliminary Examination Report mailed Jul. 17, 2008 for International Application No. PCT/US2007/000102.

Light-Emitting Diode, Wikipedia, Nov. 17, 2008, pp. 1-15, at http://en.wikipedia.org/wiki/Light-emitting_diode.

Cree XLamp LED Reliability, Cree LED Light, Sep. 2007, pp. 1-9, Cree, Inc., Durham, NC 27703, at www.cree.com/xlamp.

Golden Dragon Engineering Kit, OSRAM Opto Semiconductors GmbH, Oct. 4, 2006, Regensburg, Germany, at www.osram-os.com.

Power Light Source Luxeon Rebel, Technical Datasheet DS56, Philips, Jul. 2008, Philips Lumileds Lighting Company, US, at www.luxeon.com.

Specification for NICHIA Chip Type White LED, Model NSSW108T, Cat. No. 070606, pp. 1-12, NICHIA Corporation.

Haque, High-power LED Stud-bump Packaging, Advanced Packaging, Apr. 2006, pp. 1-6, at http://ap.pennnet.com/Articles/Article_Display.cfm?Section+ARTCL&ARTICLE_ID=252779&VERSI.

Wong et al., Packaging of Power LEDS Using Thermosonic Bonding of Au-Au Interconnects, SMTA Int'l Conf., Sep. 24, 2006, pp. 1-2, SMTA, Edina, MN at www.smta.org.

Moreno, LED Intensity Distribution, International Optical Design Conf. 2006, Jun. 2006, Optical Society of America, ISBN: 1-55752-814-4.

Moreno et al., Modeling the Radiation Pattern of LEDs, Optics Express, Feb. 4, 2008, vol. 16, No. 3, Optical Society of America #90469s.

Cho et al., Dry etching of GaN and related materials; Comparison of techniques, IEEE Journal of Selected Topics in Quantum Electronics 4(3):557-563, 1998.

Mishra, GaN Vacuum Microelectronic Electron Emitter with Integrated Extractor, Santa Barbara CA, Jan. 28, 2009 at my.ece.ucsb.edu/mishra/vacuummicroelec/finalrepnsf.pdf.

He et al., GaN layers re-grown on etched GaN templates by plasma assisted molecular beam epitaxy, Mat. Res. Soc. Symp. vol. 798, 2004 Materials Research Society, Richmond, VA.

Gallium Nitride Film Growth, downloaded Feb. 6, 2009 at www.onr.navy.mil/sci_tech/31/312/ncsr/materials/gan/filmgrowth.asp?css_printer&.

International Search Report and Written Opinion for International Application No. PCT/US2010/046108, mailed Oct. 18, 2010, 7 pgs.

European Search Report and Written Opinion for Application No. EP 07716261, mailed Nov. 30, 2010, 8 pgs.

International Preliminary Report on Patentability for International Application No. PCT/US2009/048787 mailed Jan. 13, 2011, Patent Cooperation Treaty, 7 pgs.

International Preliminary Report on Patentability for International Application No. PCT/US2009/048788 mailed Jan. 13, 2011, Patent Cooperation Treaty, 6 pgs.

Notice of Allowance for U.S. Appl. No. 12/788,094, mailed May 3, 2011, 11 pgs.

* cited by examiner

LED SYSTEM AND METHOD

RELATED APPLICATIONS

This application claims the benefit of priority under 35 U.S.C. 119(e) to U.S. Provisional Patent Application No. 60/827,818, entitled "SHAPED LIGHT EMITTING DIODES", to Dung T. Duong et al., filed Oct. 2, 2006, and to U.S. Provisional Patent Application No. 60/881,785, entitled "SYSTEM AND METHOD FOR A SHAPED SUBSTRATE LED", to Dung T. Duong et al., filed Jan. 22, 2007, both of which are hereby fully incorporated by reference herein.

TECHNICAL FIELD OF THE INVENTION

This disclosure regards light emitting diodes ("LEDs"). More particularly, embodiments of systems and methods described herein relate to increasing or controlling light output of an LED. Even more particularly, embodiments relate to increasing or controlling light output of an LED by shaping portions of the LED substrate.

BACKGROUND

Light emitting diodes ("LEDs") are ubiquitous in electronics. They are used in digital displays, lighting systems, computers and televisions, cellular telephones and a variety of other devices. Developments in LED technology have led to methods and systems for the generation of white light using one or more LEDs. Developments in LED technology have led to LEDs that generate more photons and thus more light than previously. The culmination of these two technological developments is that LEDs are being used to supplement or replace many conventional lighting sources, e.g. incandescent, fluorescent or halogen bulbs, much as the transistor replaced the vacuum tube in computers.

LEDs are produced in a number of colors including red, green and blue. One method of generating white light involves the use of red, green and blue LEDs in combination with one another. A lighting source that is made of combinations of red, green and blue (RGB) LEDs will produce what is perceived as white light by the human eye. This occurs because the human eye has three types of color receptors, with each type sensitive to either blue, green or red colors.

A second method of producing white light from LED sources is to create light from a single-color (e.g. blue), short wavelength LED, and impinge a portion of that light onto phosphor or similar photon conversion material. The phosphor absorbs the higher energy, short wavelength light waves, and re-emits lower energy, longer wavelength light. If a phosphor is chosen that emits light in the yellow region (between green and red), for example, the human eye perceives such light as white light. This occurs because the yellow light stimulates both the red and green receptors in the eye. Other materials, such as nano-particles or other similar photo-luminescent materials, may be used to generate white light in much the same way.

White light may also be generated utilizing an ultraviolet (UV) LED and three separate RGB phosphors. White light may also be generated from a blue LED and a yellow LED and may also be generated utilizing blue, green, yellow and red LEDs in combination.

Current industry practice for construction of LEDs is to use a substrate (typically either single-crystal Sapphire or Silicon Carbide), onto which is deposited layers of materials such as GaN or InGaN. One or more layers (e.g. GaN or InGaN) may allow photon generation and current conduction. Typically, a first layer of Gallium Nitride (GaN) is applied to the surface of the substrate to form a transition region from the crystal structure of the substrate to the crystal structure of doped layers allowing for photon generation or current conduction. This is typically followed by an N-doped layer of GaN. The next layer can be an InGaN, AlGaN, AlInGaN or other compound semiconductor material layer that generates photons and that is doped with the needed materials to produce the desired wavelength of light. The next layer is typically a P doped layer of GaN. This structure is further modified by etching and deposition to create metallic sites for electrical connections to the device.

During the operation of an LED, as in a traditional diode, extra electrons move from an N-type semiconductor to electron holes in a P-type semiconductor. In an LED, photons are released in the compound semiconductor layer to produce light during this process.

In a typical manufacturing process, the substrate is fabricated in wafer form and the layers are applied to a surface of the wafer. Once the layers are doped or etched and all the features have been defined using the various processes mentioned, the individual LEDs are separated from the wafer. The LEDs are typically square or rectangular with straight sides. This can cause significant efficiency losses and can cause the emitted light to have a poor emission pattern. A separate optical device, such as a plastic dome, is often placed over the LED to achieve a more desirable output.

In nearly all LED applications, it is desirable to maximize light output for a given power input, a quantity often expressed in lumens per watt (lm/W) for white light and longer wavelength light, or milliwatts per watt (mW/W) for shorter wavelength light such as blue. Existing LED technologies may attempt to increase this ratio, typically referred to as "overall efficiency" or "wall-plug efficiency." However, existing LED technologies still suffer poor overall efficiency and low extraction efficiency.

SUMMARY

This disclosure regards an LED having a substrate shaped to achieve greater efficiency than previous LEDs. The sidewalls of embodiments of the LED may be shaped so as to maximize the light output of the LED using total internal reflection and can be shaped to achieve a desired intensity distribution. Additionally, the exit face of the LED may be selected to conserve radiance.

One embodiment includes a method of manufacturing an LED comprising determining a size of an exit face of a shaped substrate portion of the LED that has at least 70% of a minimum area necessary to conserve radiance for a desired half-angle of light projected from the LED; determining a distance between the exit face and an interface between the shaped substrate portion and a quantum well region of the LED; determining shapes and positions of a set of sidewalls of the shaped substrate portion of the LED so that each sidewall is positioned and shaped to cause at least a majority of rays having a straight transmission path from the interface to that sidewall to reflect to the exit face with an angle of incidence at the exit face at less than or equal to a critical angle at the exit face; and forming the substrate portion of the LED in accordance with the determined size of the exit face, shapes and positions of the set of sidewalls and distance between the exit face and the interface.

Another embodiment comprises a method of shaping an LED comprising providing a wafer comprising a substrate and one or more layers for a quantum well region of the LED and grinding the substrate to form a shaped substrate portion of the LED. The shaped substrate portion can comprise an exit face opposite from and a distance from an interface with the quantum well region of the LED, the exit face having at least 70% of a minimum area necessary to conserve radiance for a desired half-angle of light projected from the shaped substrate; and a set of sidewalls, wherein each sidewall is positioned and shaped so that at least a majority of rays having a straight transmission path from the interface to that sidewall reflect to the exit face with an angle of incidence at the exit face of less than or equal to a critical angle at the exit face.

Yet another embodiment of shaping an LED can comprise providing a wafer comprising a substrate and one or more layers for a quantum well region of the LED and etching the substrate to form a shaped substrate portion of the LED. The shaped substrate portion can comprise an exit face opposite from and a distance from and interface with the quantum well region of the LED, the exit face having at least 70% of a minimum area necessary to conserve radiance for a desired half-angle of light projected from the shaped substrate and a set of sidewalls, wherein each sidewall is positioned and shaped so that at least a majority of rays having a straight transmission path from the interface to that sidewall reflect to the exit face with an angle of incidence at the exit face of less than or equal to a critical angle at the exit face.

Yet another embodiment can comprise a method of manufacturing an LED comprising providing a substrate and one or more layers for a quantum well region of the LED and removing material from the substrate to form a shaped substrate portion of the LED. The shaped substrate portion can comprise two or more exit faces having a combined area that is at least 70% of a minimum area necessary to conserve radiance for a desired half-angle of light projected from the LED and a set of sidewalls, wherein each sidewall is positioned and shaped so that at least a majority of rays having a straight transmission path from the interface to that sidewall reflect to an exit face of the two or more exit faces with an angle of incidence at that exit face of less than or equal to a critical angle at that exit face.

Embodiments of systems and methods provide an LED that provides technical advantages over the prior art by projecting light with a desired half-angle and light output profile, while conserving brightness. Embodiments can provide, for example, light in 10 to 60 degrees half angle (or other half angles) with high efficiency.

Embodiments provide yet another advantage by providing for light output with uniform or near uniform intensity distributions.

Yet another advantage provided by embodiments is that light can be projected with a desired shape and light output profile.

BRIEF DESCRIPTION OF THE FIGURES

A more complete understanding of the embodiments and the advantages thereof may be acquired by referring to the following description, taken in conjunction with the accompanying drawings in which like reference numbers indicate like features and wherein.

DETAILED DESCRIPTION

Figure 1A:
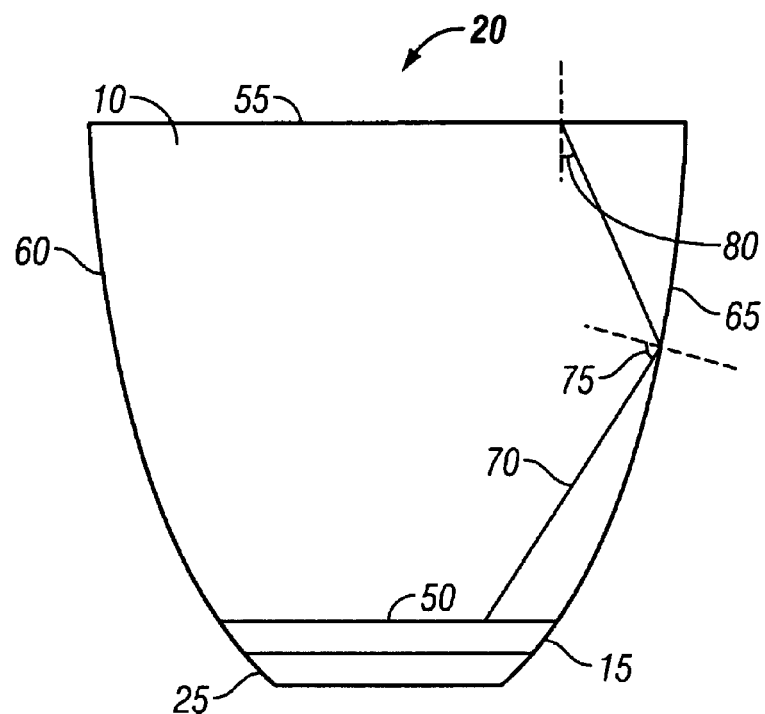
FIGS. 1A-1B are diagrammatic representations of embodiments of LEDs.

Embodiments are illustrated in the FIGURES, like numerals being used to refer to like and corresponding parts of the various drawings.

Embodiments of shaped substrate LEDs may be shaped so as to increase or shape the light emission from the LED. According to one embodiment, the substrate is shaped so that all or a supermajority of the light generated by the quantum well region of the LED is transmitted out the exit face of the substrate of the LED. To this end, the exit face can be sized to take into account principles of conservation of radiance. In one embodiment, the exit face may be the minimum size that allows all or a supermajority of the light entering the substrate through the interface between the quantum well region and the substrate to exit the exit face, thereby combining the desire to conserve radiance with the desire to reduce size, particularly the size of the exit face. Additionally, the sidewalls of the substrate may be shaped so that reflection or total internal reflection ("TIR") causes light beams incident on substrate sidewalls to reflect towards the exit face and be incident on the exit face with an angle less than or equal to the critical angle. Consequently, light loss due to TIR at the exit face is reduced or eliminated. In a further embodiment, to insure that light striking a sidewall is reflected within the substrate and does not pass through the sidewall, a sidewall or sidewalls of a substrate may also be coated with a reflective material that reflects light to prevent the exitance of light through the sidewall.

While theoretically 100% of the light generated by the quantum wells of the LED exits the exit face, various embodiments may cause lesser amounts of light to exit the exit face while still providing significant improvements over prior LED light emissions. For example, light emitted from the exit surface of the LED may be emitted from the exit surface with a cone half angle of 10-60 degrees with approximately 79% efficiency (there is approximately a 21% efficiency loss due to fresnel losses for a silicon carbide substrate material of 2.73 index of refraction) with a desired intensity profile, exitance profile or other light output profile.

Fresnel losses (e.g. losses at the interface between two mediums such as at the exit face of an LED and air or other medium) occurs when light traverses from a medium of higher index to a medium of lower index. Normal incident fresnel losses are described by the equation:

$$(N_1-N_2)^2/((N_1+N_2)^2),$$

wherein $N_1$ and $N_2$ are the indices of refraction of the two mediums. As an example, for an LED having a silicon carbide substrate, $N_1$=2.73 (approximate IOR of silicon carbide), $N_2$=1 (approximate IOR of air), yielding Fresnel losses of approximately 21.5%. If the LED utilizes GaN in the quantum well region, Fresnel losses at the interface between the quantum well region ($N_1$=2.49) and the silicon carbide substrate ($N_2$=2.73) will be 0%. Fresnel losses at the exit face to air interface may be reduced or overcome with anti-reflective coatings.

As described above, the exit face of an LED substrate can be shaped to conserve radiance. The passage of light along an optic path, either within a single medium or from one medium to another, is governed by the law of Conservation of Radiance, also referred to as the Brightness Theorem, which is expressed by the Etendue equation:

$$\text{Entendue Equation:} \frac{\Phi_1}{N_1^2 A_1 \Omega_1} = \frac{\Phi_2}{N_2^2 A_2 \Omega_2} \quad [\text{EQN. 1}]$$

$\Phi_1$=light flux (lumens) of region 1
$N_1$=IOR of medium of region 1
$A_1$=area of entrance to region 1
$\Omega_1$=solid angle (steradians) that fully contains the light of region 1
$\Phi_2$=light flux (lumens) of region 2
$N_2$=IOR of medium of region 2
$A_2$=area of entrance to region 2
$\Omega_2$=solid angle (steradians) that fully contains the light of region 2

The area of the exit face of a shaped substrate can be selected to conserve radiance of light entering the substrate from the quantum wells for a desired half angle. Consequently, light can be emitted in a desired half angle with high efficiency. This is unlike traditional LEDs that both emit light with a half angle that is undesirable for many applications, therefore requiring additional optical devices to shape the light; and, emit a significant percentage of light through the sidewalls because the exit face is not large enough to conserve radiance; while also suffering absorption losses due to the light never escaping the substrate.

Furthermore, the passage of light from a medium of one index of refraction to a medium of a different IOR is governed by Snell's Law. Snell's law defines the relationship between the angle of approach of a light ray as measured from the normal to the interface surface, and the angle of departure of that ray from the interface, as a function of the indices of refraction of both media.

$$\text{Snell's Law: } N_1 \sin(\Theta_1) = N_2 \sin(\Theta_2) \quad [\text{EQN. 2}]$$

$\Theta_1$=angle of incidence of ray approaching interface surface
$N_1$=IOR of medium 1
$\Theta_2$=angle of refraction of ray departing interface surface
$N_2$=IOR of medium 2

In the case of the passage of light from a medium of higher IOR to a medium of lower IOR, the maximum angle at which a light ray may strike the interface surface between the media and still pass through the interface is called the critical angle.

Fundamentally, light originating from the medium of higher IOR must approach the media interface at angles not exceeding the critical angle if the light is to pass through the interface and into the medium of lower IOR. For example, in an LED comprised of a substrate and a quantum well region, the substrate medium and the quantum well medium may form an interface that light generated by the quantum well regions traverses. Rays that approach at angles greater than the critical angle will be reflected back within the medium of higher IOR at the interface between the media and will not pass into the medium of lower IOR. This is referred to as total internal reflection ("TIR").

In a typical LED, the quantum well region has an IOR of approximately 2.49. When these layers are constructed on a sapphire substrate with an IOR of 1.77, the light that can be transmitted into the sapphire is inherently limited by the application of Snell's law and the Brightness Theorem. For LEDs with a substrate of silicon carbide, which may have an IOR of approximately 2.73, the quantum well region has a lower IOR (e.g. approximately 2.49) than the silicon carbide, and therefore Snell's law does not prohibit any of the generated light from passing into the silicon carbide.

In traditional LEDs, a significant portion of light encountering a substrate to air interface will be trapped in the substrate due to TIR. In some cases, a separate optical device (e.g. a solid plastic dome or lens) is used to increase the IOR of the medium into which light passes from the substrate, reducing TIR in the substrate. These separate optical devices may still suffer from losses due to TIR, and the extraction efficiency of domes remains relatively low. Moreover, the use of a dome requires additional steps in manufacturing after the LED is formed. Embodiments of shaped substrate LEDs, on the other hand, can be shaped to minimize or eliminate light loss due to TIR at the exit face of the substrate. According to one embodiment, the exit face of the substrate can be spaced from the interface with the quantum well region by a distance so that none of the rays with a direct transmission path to the exit face experience TIR at the exit face. Additionally, the sidewalls can be shaped to reflect rays encountering the sidewalls to the exit face with an angle of incidence at the exit face that is less than the critical angle, thus allowing all internally reflected rays to exit the exit face of the LED substrate as well.

FIG. 1A is a diagrammatic representation of one embodiment of a LED 20 including a substrate 10 and quantum well region 15 (that may comprise one or more layers or regions of doping). Quantum well region 15 includes a light emitting region 25, typically a compound semiconductor such as InGaN or AlInGaP or AlGaN. Photons from quantum well region 15 may enter substrate 10 through interface 50. LED 20 can be a wire bond, flip chip or other LED known or developed in the art. Both substrate 10 and quantum well region 15 form sidewall 60, sidewall 65 or other sidewalls. In other words, quantum well region 15 is shaped in conformance with substrate 10. LED 20 further includes exit face 55 that may be substantially the same shape as, substantially parallel to and substantially rotationally aligned with interface 50 within the tolerance of the manufacturing process. The area of exit face 55 can be chosen to conserve brightness for a desired half angle according to the conservation of radiance (sometimes called the conservation of brightness) equation:

$$\frac{\Phi_2 n_1^2 A_1 \Omega_1}{\Phi_1 n_2^2 \Omega_2} = A_2 \quad [\text{EQN. 1}]$$

$\Phi_1$=light flux traversing interface 50;
$\Phi_2$=light flux exiting exit face 55, $\Phi_1$=$\Phi_2$ for conservation of brightness;

$\Omega_1$=effective solid angle whereby light traverses interface 50;

$\Omega_2$=effective solid angle whereby light leaves exit face 55;

$A_1$=area of interface 50;

$A_2$=area of exit face 55;

$n_1$=refractive index of material of substrate 10;

$n_2$=refractive index of substance external to substrate 10 (e.g. air or other medium).

$A_2$ represents the minimum surface area of exit face 55 such that light is conserved per the above equation. Assume, for example: quantum well region 15 forms a 1 mm square so that interface 50 has an area approximately 1 mm square, $n_1$=1.77, $n_2$=1, $\Omega_1$=3, $\Omega_2$=1, then $A_2$ must be at least 9.3987 mm$^2$ to conserve radiance (i.e. the minimum size of exit face 55 so that all of the light traversing interface 50 can be emitted from exit face 55 for a desired half angle). While in this example the effective solid angles are given, methods for determining $\Omega_1$ and $\Omega_2$ for a desired half angle are discussed below in conjunction with FIGS. 6A-6E. It should be noted that the square profile is a rectangular profile with sides of equal length.

$A_2$ according to EQN. 1 is the minimum possible size for a given output cone angle or Emission Half Angle to conserve radiance. Consequently, to conserve radiance, $A_2$ should be at least the size determined from EQN. 1, but may be larger. For example, $A_2$ may be made slightly larger to compensate for tolerances in the manufacturing process, errors in the size or shape of quantum well region 15 or other factors.

In the case where $A_2$ is made larger than the value determined by equation 1, flux will be conserved, but exitance (defined as flux per unit area) may be reduced from the maximum attainable value.

To reduce the area of the exit face, however, it may be preferable that $A_2$ be as small as possible. For example, $A_2$ may be within 5% of the minimum area needed to conserve radiance. If some light power (luminous flux) may be sacrificed, $A_2$ can be smaller than the size dictated by the conservation of radiance. As one example, for one embodiment having a 1 mm by 1 mm square interface 50, exit face 55 can be 2.5 mm$^2$ to 5 mm$^2$ (e.g., 4.62 mm$^2$). As another example, for an embodiment having 0.3 mm×0.3 mm interface 50, exit face 55 can be 0.2 mm$^2$ to 0.5 mm$^2$ (e.g., 0.42 mm$^2$). It should be noted, however, the size ranges provided in the previous examples are provided by way of example only, and various embodiments can have a variety of sizes smaller than or greater than the example ranges. Preferably, however, $A_2$ is at least 70% of the value as determined by EQN. 1. Furthermore, the shape of exit face 55 may be different than that of interface 50.

The distance between interface 50 and exit face 55 of substrate 10—referred to as the "height" herein, though the distance may extend in other directions than the vertical—may be selected to reduce or minimize TIR of light rays traveling directly from interface 50 to exit surface 55. TIR occurs when light is incident on the surface with an angle of incidence greater that critical angle, which is defined by:

$$n_1 \sin(\theta_c) = n_2 \sin(90) \qquad [\text{EQN. 2}]$$

where $n_1$=IOR of substrate 10;

$n_2$=IOR of the medium external to the exit face of substrate 10 (e.g., air or other substance); and $\theta_c$=the critical angle.

For example, if $n_1$=1.77 and $n_2$=1, then $\theta_c$=34.4 degrees. Accordingly, the height of substrate 10 can be selected to limit the critical angle of rays incident on exit surface 55 to a range between normal to exit surface 55 and less than or equal to the critical angle.

Figure 2:
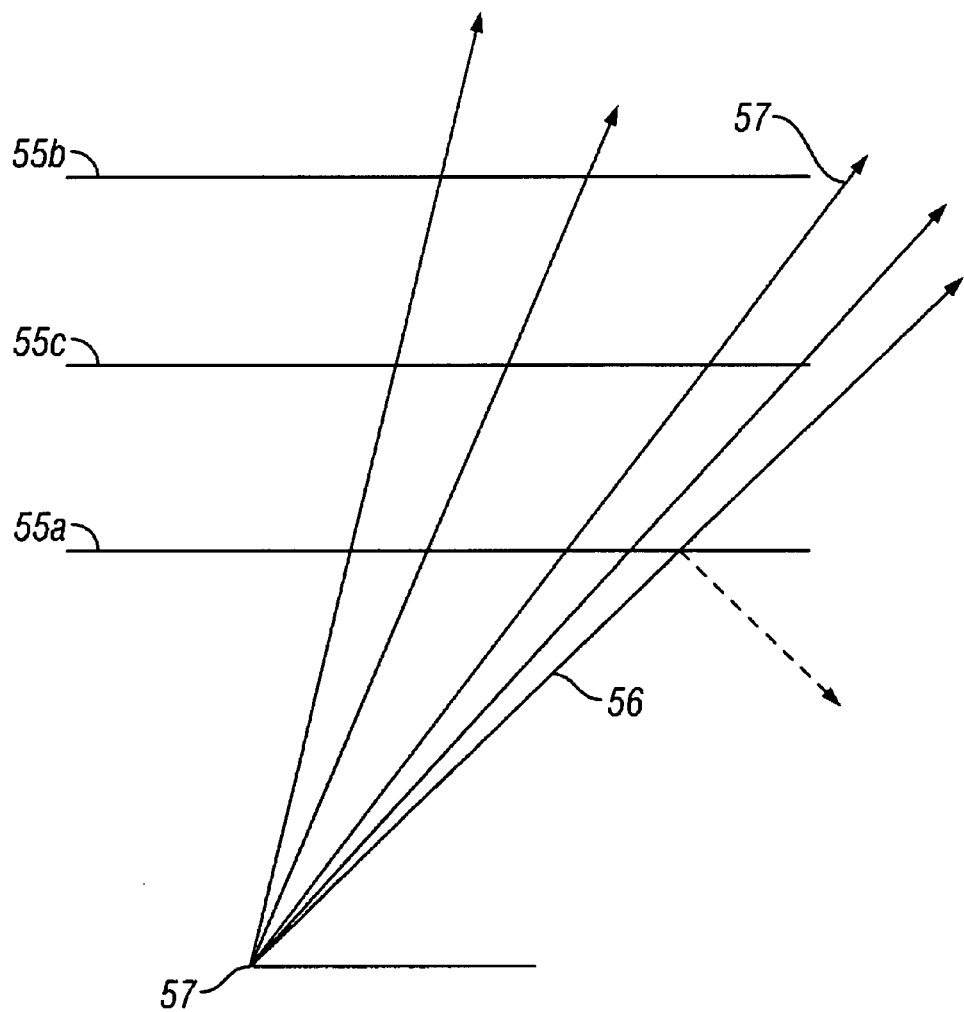
FIG. 2 is a diagrammatic representation of a set of rays traveling from a point to surfaces at different distances from the point.
Figure 3:
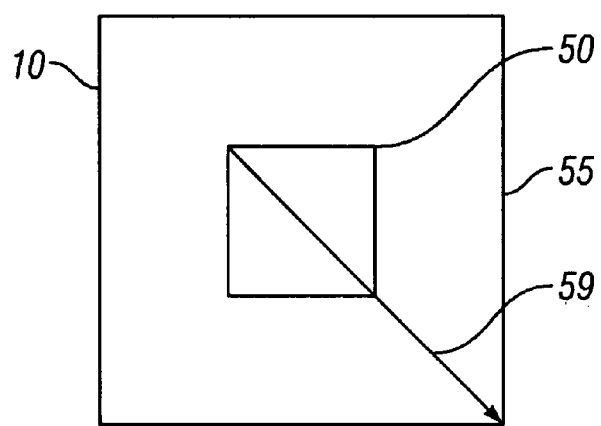
FIG. 3 provides a diagrammatic representation of a top view of an embodiment of an LED.

Referring to FIGS. 2 and 3, FIG. 2 is a diagrammatic representation of a set of rays traveling from point 57 incident on a surface 55 (represented as surfaces 55a, 55b and 55c at different distances from point 57). In the example of surface 55a, some rays (e.g., ray 56) are incident on surface 55a at greater than the critical angle, causing loss of light due to TIR. In the example of surface 55b, conversely, some rays that would be incident on surface 55b at the critical angle or somewhat less than the critical angle (e.g., ray 57) will instead be incident on the sidewalls. Preventing loss of these rays, if desired, can cause the complexity of the sidewall design to increase. Moreover, the additional height requires more room to accommodate the LED (i.e., because the LED is taller). Finally, in the case of surface 55c, rays at or less than the critical angle are incident on surface 55c while rays that would be greater than the critical angle on exit surface 55c instead are incident on the sidewalls. TIR or reflection can be used to direct the rays incident on the sidewalls to exit surface 55c as discussed below.

The limiting ray for selecting height, according to one embodiment, is the ray that travels the longest straight line distance from interface 50 to exit face 55 and is incident on exit face 55 at the critical angle. There may be more than one ray that can be selected as the limiting ray. In a square or rectangular configuration this is the ray that enters substrate 10 at a corner of interface 50 and travels in a straight line to the diagonally opposite corner of exit face 55 such that the ray would be incident on exit face 55 at the critical angle.

FIG. 3 provides a diagrammatic representation of a top view of substrate 10 and of limiting ray 59 for a square configuration. While in the preferred embodiment the height of substrate 10 is selected to limit the critical angle of rays incident on exit face 55 to a range of between normal to exit face 55 and to less than or equal to the critical angle, other heights can be selected, though the use of other heights may decrease the efficiency of LED 20. In one embodiment, the distance between the interface between the quantum well region and the substrate and the exit face of the substrate may be within 5% of the minimum height that causes all rays with a straight transmission path from the interface to the exit face to have an angle of incidence on the exit face at less than or equal to the critical angle.

Returning to FIG. 1A, with selected boundary conditions of the size and shape of interface 50, size and shape of exit face 55, distance between interface 50 and exit face 55, the sidewalls (e.g., sidewall 60, sidewall 65 and other sidewalls) of substrate 10 can be shaped to direct light incident on the inner side of the sidewalls to exit face 55 to produce a desired light output profile (e.g., an intensity profile, exitance profile or other light output profile). While for most applications the desired intensity profile is uniform or close to uniform, other distribution profiles can be achieved by varying the height and shapes of the sidewalls.

Broadly speaking, the sidewall shapes are determined so that any ray incident on a sidewall is reflected to exit face 55 and is incident on exit face 55 at the critical angle or less (i.e., so that there is no loss due to internal reflection at exit face 55). This is shown in FIG. 1A by ray 70 that has angle of incidence 75 relative to sidewall 65 that is greater than $\theta_c$ so that ray 70 is reflected to exit face 55 and has an angle of incidence 80 that is less than or equal to $\theta_c$. While, in one embodiment, the sidewalls are shaped so that all rays that encounter the inner surface of the sidewalls experience total internal reflection to exit face 55 and are incident on exit face 55 at the critical angle or less, other sidewall shapes that allow some loss can be used.

Figure 1B:
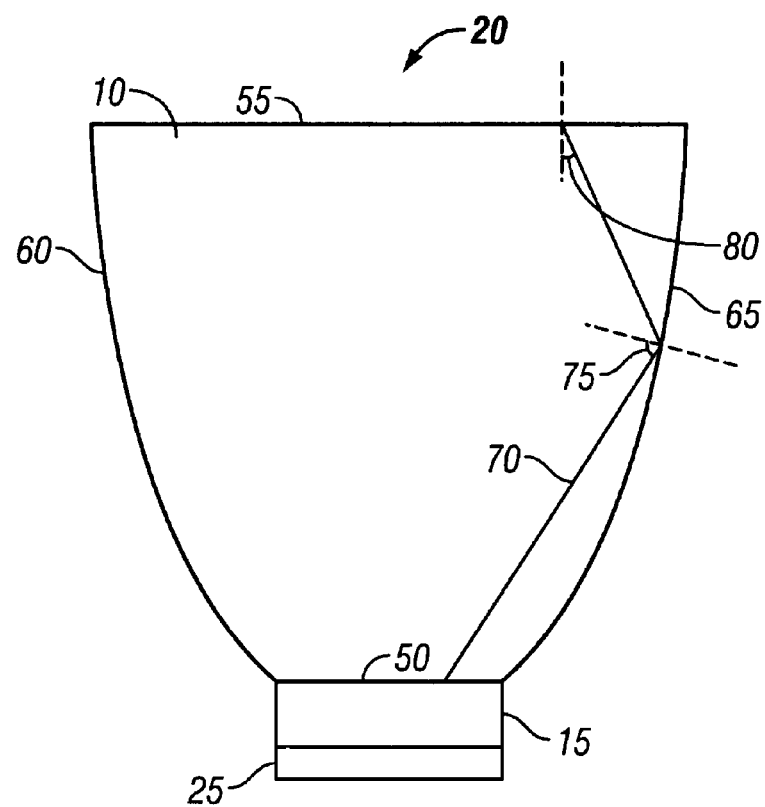

Turning to FIG. 1B, FIG. 1B is a diagrammatic representation of another embodiment of a LED 20. LED 20 comprises a substrate 10 and a quantum well region 15. Quantum well region 15 includes a light emitting region 25, typically a compound semiconductor such as InGaN or AlInGaP or AlGaN. Photons from quantum well region 15 may enter substrate 10 through interface 50. In FIG. 1B there may be more losses due to TIR in the quantum well region because the quantum well region is not shaped to appropriately direct light to interface 50 and/or exit face 55. While in the embodiments of FIGS. 1A and 1B, some sidewall shapes may not direct all the light generated by LED 20 out exit face 55, the portion of light not exiting exit face 55 will be emitted from sidewalls 65 and may be emitted near exit face 55, thus allowing for the light generated by LED 20 to be captured usefully.

Figure 4A:
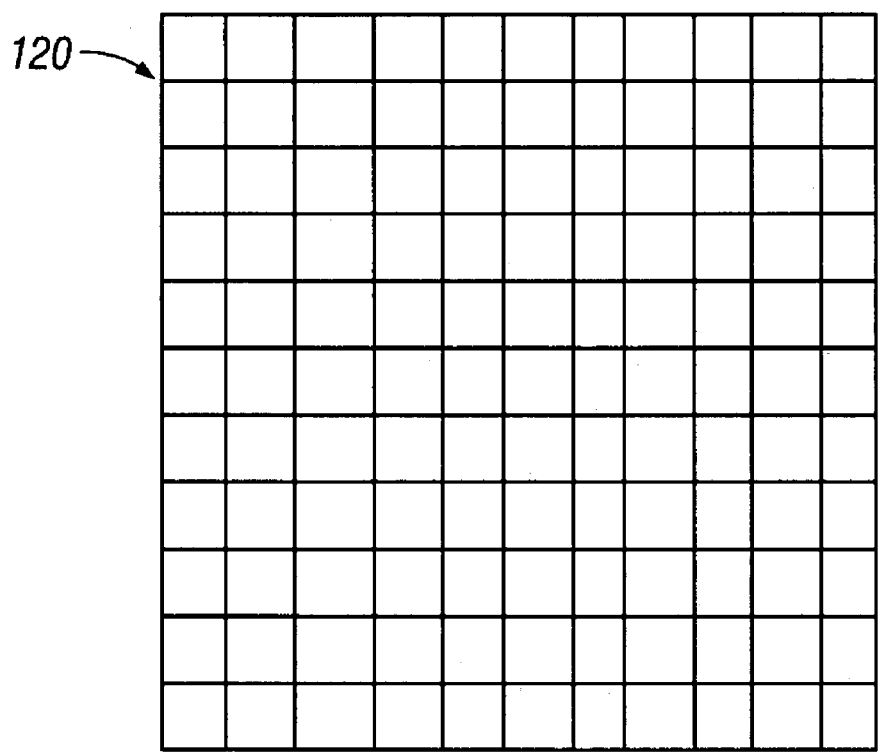
FIG. 4A is a diagrammatic representation of a cross-section of a model of an LED for determining sidewall shapes.
Figure 4A:
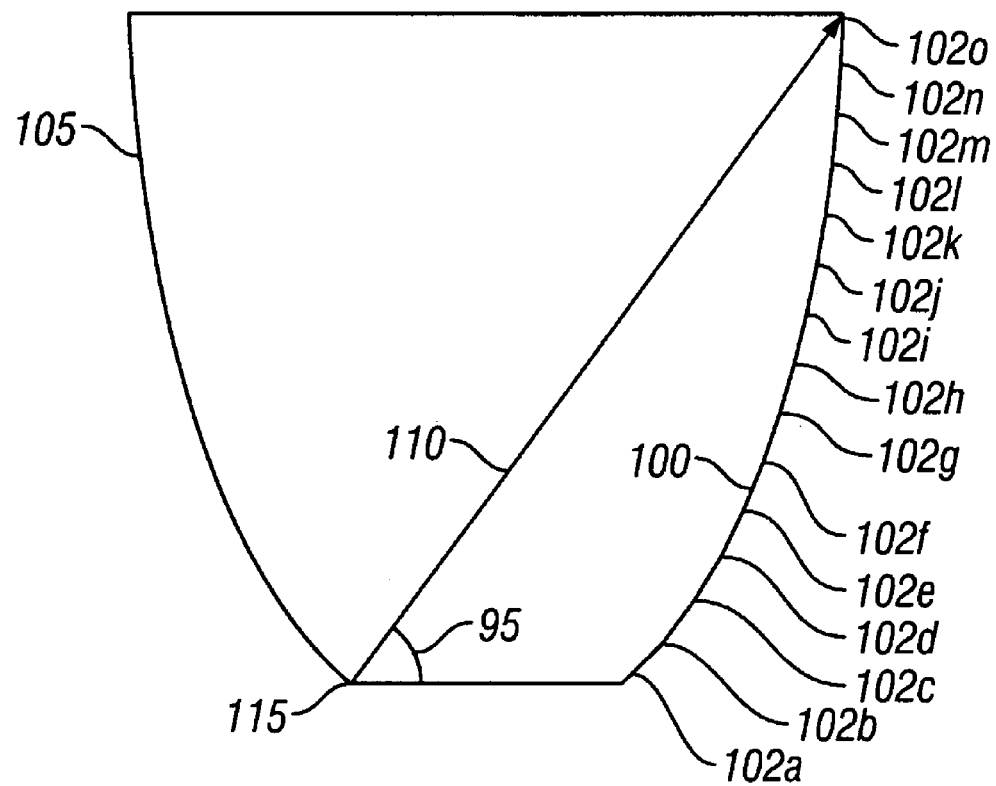

FIG. 4A is a diagrammatic representation of a cross-section of a model of a LED or a substrate of a LED for determining sidewall shapes. Sidewall shapes can be determined using computer-aided design. A model of the sidewall can be created in a computer-aided design package and simulations run to determine an appropriate sidewall shape.

According to one embodiment, each sidewall can be divided into n facets with each facet being a planar section. For example, sidewall 100 is made of fifteen planar facets 102a-102o rather than a continuous curve. The variables of each facet can be iteratively adjusted and the resulting distribution profiles analyzed until a satisfactory profile is achieved as described below. While the example of fifteen facets is used, each sidewall can be divided into any number of facets, including twenty or more facets.

Each facet can be analyzed with respect to reflecting a certain subset of rays within a substrate. This area of interest can be defined as an "angular subtense." The angular subtense for a facet may be defined in terms of the angles of rays emanating from a predefined point. Preferably, the point selected is one that will give rays with the highest angles of incidence on the facet because such rays are the least likely to experience TIR at the facet. In a substrate with a square shaped interface area, for example, this will be a point on the opposite edge of the interface.

According to one embodiment, for a selected $A_1$, $A_2$, and height, the maximum of angle 95 of any ray that will be incident on a given sidewall (e.g., sidewall 100) without being previously reflected by another sidewall can be determined. In this example, ray 110 emanating from point 115 establishes the maximum angle 95 for sidewall 100. If the maximum of angle 95 is 48 degrees and there are 15 facets for sidewall 100, each facet (assuming an even distribution of angular subtenses) will correspond to a 3.2 degree band of angle 95 (e.g., a first facet will be the area on which rays emanating from point 115 with an angle 95 of 0-3.2 degrees are incident, the second facet will be the area on which rays emanating at point 115 with an angle 95 of 3.2-6.4 degrees are incident, and so on).

For each facet, the exit angle, facet size, tilt angle, or other parameter of the facet can be set so that all rays incident on the facet experience TIR and are reflected to exit surface 55 such that they are incident on exit surface 55 with an angle of incidence of less than or equal to the critical angle. Preferably, the sidewalls are also shaped so that a ray viewed in a cross-sectional view only hits a side wall once. However, there may be additional reflection from a sidewall out of plane of the section. For a full 3D analysis, a ray that strikes a first sidewall near a corner, may then bounce over to a second side wall, adjacent to the first, and from there to the exit face. A curve fit or other numerical analysis may be performed to create a curved sidewall shape that best fits the desired facets. In FIG. 4A, for example, sidewall 105 is curved rather than a set of planar facets.

To optimize the variables for each facet, a simulated detector plane 120 can be established. Detector plane 120 can include x number of detectors to independently record incident power. A simulation of light passing through the substrate may be performed and the intensity and irradiance distributions as received by detector plane 120 analyzed. If the intensity and irradiance distributions are not satisfactory for a particular application, the angles and angular subtenses of the facets can be adjusted, a new curved surface generated and the simulation re-performed until a satisfactory intensity profile, exitance profile or other light output profile is reached. Additional detector planes can be analyzed to ensure that both near field and far field patterns are satisfactory. Alternatively, the simulation(s) can be performed using the facets rather than curved surfaces and the surface curves determined after a desired light output profile is reached. In yet another embodiment, the sidewalls can remain faceted and no curve be generated.

Figure 4B:
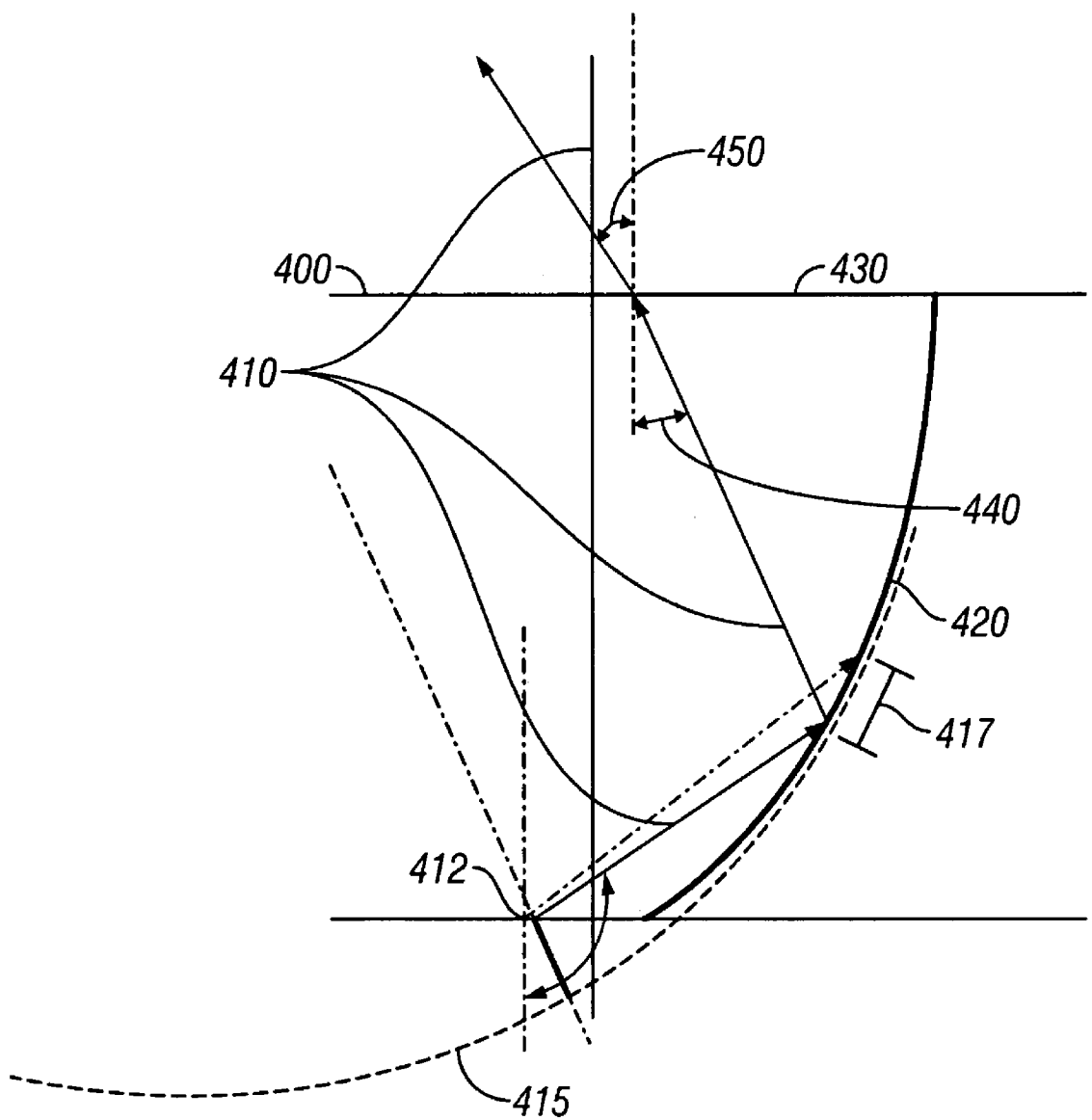
FIG. 4B is a diagrammatic representation of an embodiment of a portion of a sidewall of an LED.

According to another embodiment, the sidewall shape can be selected based on multiple parabolas with each planer facet representing a linear approximation of a portion of a parabola. For example, FIG. 4B is a diagrammatic representation of a portion 400 of a LED. In FIG. 4B, a hypothetical ray 410 is depicted that emanates from the focus 412 of a parabola 415 and intersects sidewall 420 such that it is reflected off sidewall 420 due to TIR and traverses the substrate to intersect exit face 430 at an exit angle 440 that is less than the critical angle and exits the substrate into air or other medium. As can be seen from FIG. 4B, at the transition from the substrate to air, ray 410 bends as described by Snell's law. Since the tangent point of the sidewall is determined from a parabola and because the ray incident and reflected off the sidewall is in the same medium, the ray will be parallel to the optical axis of the parabola. Thus, light is projected with a half-angle 450. Angular subtenses defining the shape of sidewall 420 may be adjusted such that hypothetical ray 410 reflects off sidewall 420 such that ray 410 traverses exit face 430 with a desired exit angle 440 or projects light with a desired half angle 450.

In one embodiment, when fabricating a sidewall or calculating the angular subtense of a sidewall, finer subtenses may be used towards the base of the sidewall (i.e. nearer the quantum well region) because the effects of the subtense are greater or more acute upon reflection near the base, and thus finer subtenses allow for a sidewall with better TIR properties, whereas further from the base, where the effects of the subtenses are less, the subtenses may be coarser. Thus, facets of a sidewall may be numerically greater towards the base of a shaped substrate LED. In one embodiment, a sidewall may have 20 or more facets, with finer facets at the base of the sidewall, wherein the facets approximate one or more subtenses.

A facet can be a linear approximation of a portion 417 of parabola 415. The parameters of parabola 415 can be adjusted until portion 417 achieves the desired goal of all rays incident on portion 417 reflecting to exit face 430 such that the rays have an exit angle 440 of less than the critical angle. Each facet can be formed from a parabola having different parameters. Thus, a facet for one angular subtense may be based on a parabola rather than an adjoining facet. A 20-facet sidewall, for example, may be based on 20 different parabolas.

Figure 4C:
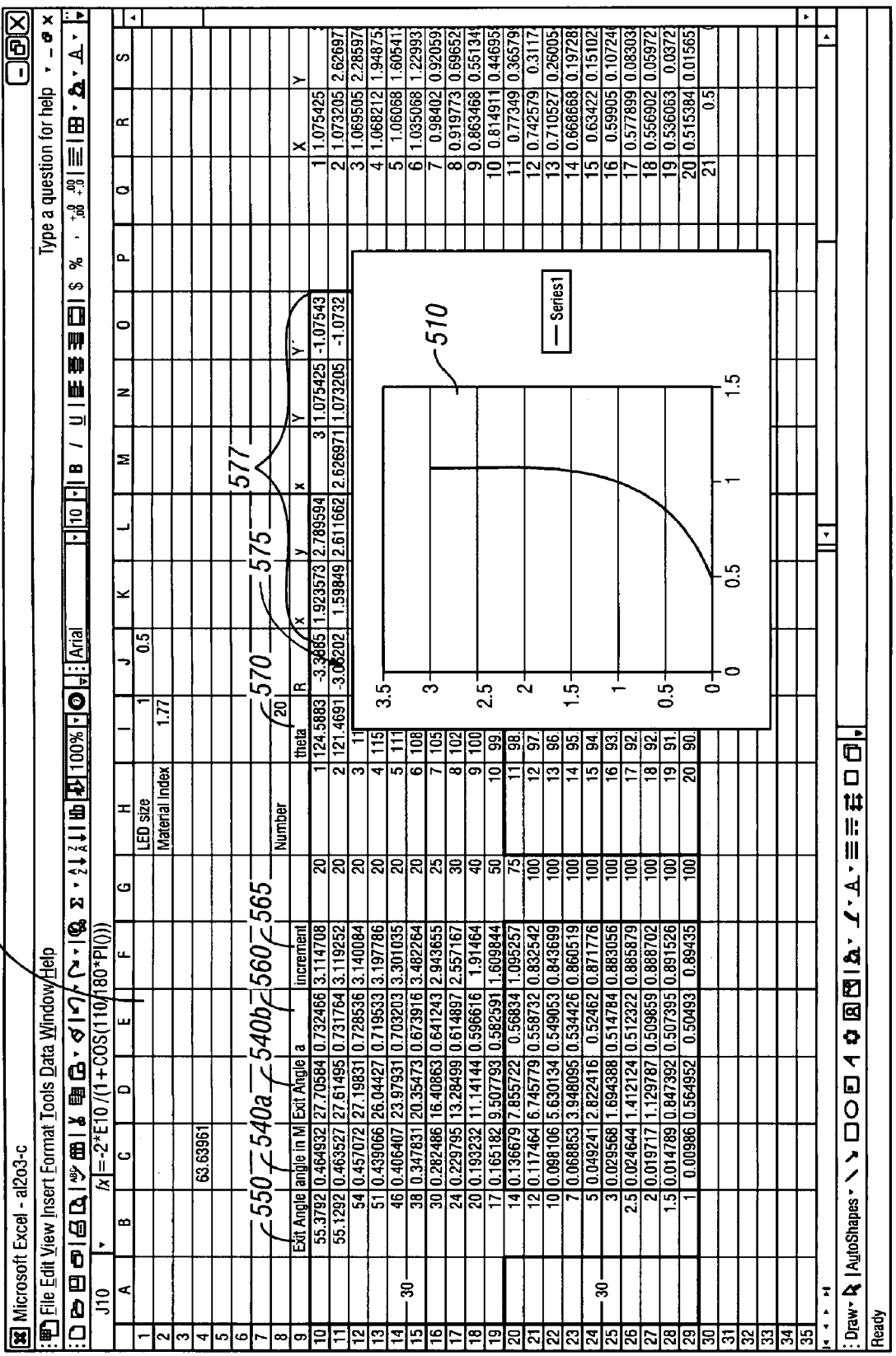
FIG. 4C is a diagrammatic representation illustrating that the facets for a sidewall can be defined using a computer program.

FIG. 4C is a diagrammatic representation illustrating that the facets for a sidewall can be defined using a computer program such as Microsoft Excel (Microsoft and Excel are trademarks of Redmond, Wash.-based Microsoft Corporation). The graphing feature in Microsoft Excel can be used to create a graph, shown at 125, of a sidewall shape. The same general shape can be used for each sidewall or different shapes for different sidewalls. A shaped substrate with the specified sidewall shape (or with a curved sidewall shape based on the specified facets) can be analyzed in, for example, Zemax optical design program (Zemax is a trademark of Zemax Development Corporation of Bellevue, Wash.). A computer simulation can be conducted in Zemax to generate a ray trace and an intensity and irradiance distribution profile. If the resulting intensity and irradiance profile has an unsatisfactory distribution or the transmission efficiency of the shaped substrate is too low, the variables of the various facets can be adjusted and the simulations performed again. This process can be automated through the use of a computer program to automatically adjust facet variables.

More specifically, FIG. 4C depicts a spreadsheet 500 that can be utilized to design a sidewall shape as shown in graph 510 through the specification of angular subtenses. Projected half angle column 550 contains a plurality of angles that correspond to projected half angle 450 of FIG. 4B. Exit angle columns 540a (in radians) and 540b (in degrees) contain a plurality of exit angles corresponding to exit angle 440 of FIG. 4B. More particularly, all or a subset of the angles in column 540a may be angles that are less than the critical angle such that light rays intersecting the exit face at those angles traverse the exit face, exiting the substrate. Columns 540a and 540b may be utilized to develop parabola focus column 560, containing a plurality of foci defining different parabolas. Angular subtense column 565 contains a plurality of angles (in radians) that define the limits of an angular subtense that can be used in conjunction with parabola focus column 560 to define the shape of a sidewall such that a ray from the quantum well region reflects off the sidewall to exit the exit face at less than the critical angle. Using the values contained in parabola focus column 560 and angular subtense column 565, theta column 570 and radius column 575 can be developed wherein corresponding values in columns 570 and 575 correspond to points on a desired parabola for the angular subtense. In turn, theta column 570 and radius column 575 can be utilized to develop Cartesian coordinates for points on a sidewall (e.g. coordinate transformation columns 577) that approximate the parabola for the angular subtense.

For example, a user can specify the LED size (i.e., the area of the interface between the substrate and quantum well region) and the material index. Using the example of an LED having a size of 1, and an index of refraction 1.77, a row in screen 500 can be completed as follows. The user can specify an exit angle in air (assuming air is the medium in which the LED will operate) in column 550. In the example of the first row, the user has selected 55.3792 degrees. The exit angle in the substrate can be calculated as sin(55.3792/180*π)/1.77 or 0.4649323 radians, column 540a. Column 540b can be calculated as a sin(0.4649323)/π*180=27.2058407. The focus of the parabola can be calculated as 1 (size)/2* (1+cos(π/2−27.2058407/180*π))=0.732466. Angular subtense column 565 can be calculated based on the number in the next column (representing the relative size of a particular facet) as (90−27.7058047)/20=3.114708. Theta column 570 can calculated using a selected number of facets (in this example 20). For example, in the first row theta is calculated as (90−27.7058407)+3.114708*20=124.5883. The radius of the parabola (column 575) for the first facet can be calculated as 2*0.732466/(1+cos(124.5883/180*π)). The contents of coordinate transformation columns 577 can be calculated as follows for the first row: x=−3.3885*cos(124.5883/180*π)= 1.923573; y=−3.3885*sin(124.5883/180*π)=2.789594, X= 1.923573*cos(27.7058407/180*π)+2.789594*sin (27.7058407/180*π); Y=2.789594*cos(27.7058407/ 180*π)−1.923573*sin(27.7058407/180*π)−1(size)/2= 1.075452 and Y'=−Y. The X, Y coordinates can then be used as data point inputs for a shape fitting chart in Excel. For example graph 510 is based on the data points in the X and Y columns (with the Y column values used as x-axis coordinates and the X column values used as y-axis coordinates in graph 510). In addition to the X and Y values a starting value can be set (e.g., 0.5 and 0). The shape from graph 510 can be entered into an optical design package and simulations run. If a simulation is unsatisfactory, the user can adjust the values in spreadsheet 500 until a satisfactory profile is achieved.

Figure 4D:
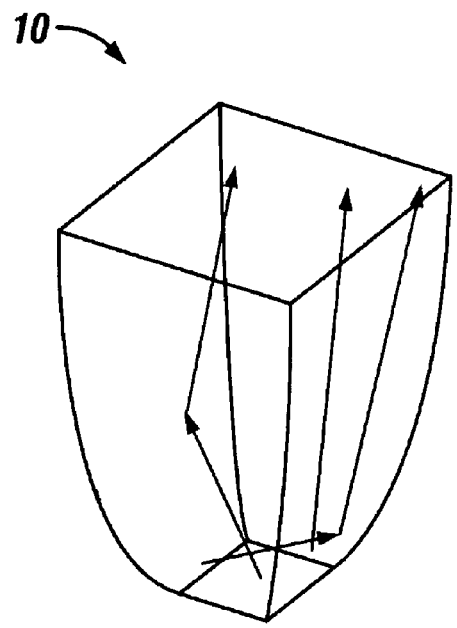
FIG. 4D is a diagrammatic representation of one embodiment of an LED with sidewalls shaped to cause TIR so that rays are reflected from the sidewalls to the exit surface.

In one embodiment, when a satisfactory light transmission efficiency and irradiance and intensity profiles are achieved, a LED with a substrate having the specified parameters can be produced. An example of such a LED is shown in FIG. 4D which provides a diagrammatic representation of one embodiment of a LED having a substrate with sidewalls shaped to cause TIR so that rays are reflected from the sidewalls to the exit surface. The shape of each sidewall, in this embodiment, is a superposition of multiple contoured surfaces as defined by the various facets. While a curve fit may be performed for ease of manufacturability, other embodiments can retain faceted sidewalls. While in FIG. 4D, the area of the quantum well region is shown as being square or rectangular, this is by way of illustration and not limitation. For example, the shape of the area of the quantum well region can be any of a variety of shapes, e.g. circular, rectangular, triangular. Likewise, the shape of the exit face of a LED can be any of a variety of shapes, e.g. circular, rectangular, triangular.

Returning to FIGS. 1A and 1B, as described above with regard to FIGS. 1A and 1B, various boundary conditions, particularly the area of exit face 55 of substrate 10, are determined for substrate 10 so that light is conserved. The minimum area of exit face 55 can be determined from EQN. 1 above, which relies on various effective solid angles. Typically, the effective solid angle of light is determined based on equations derived from idealized sources that radiate as Lambertian emitters, but that are treated as points because the distances of interest are much greater than the size of the source. The observed Radiant Intensity (flux/steradian) of a Lambertian emitter varies with the angle to the normal of the source by the cosine of that angle. This occurs because although the radiance (flux/steradian/m$^2$) remains the same in all directions, the effective area of the emitter decreases to zero as the observed angle increases to 90 degrees from normal. Integration of this effect over a full hemisphere results in a projected solid angle value equal to π steradians.

Figure 5:
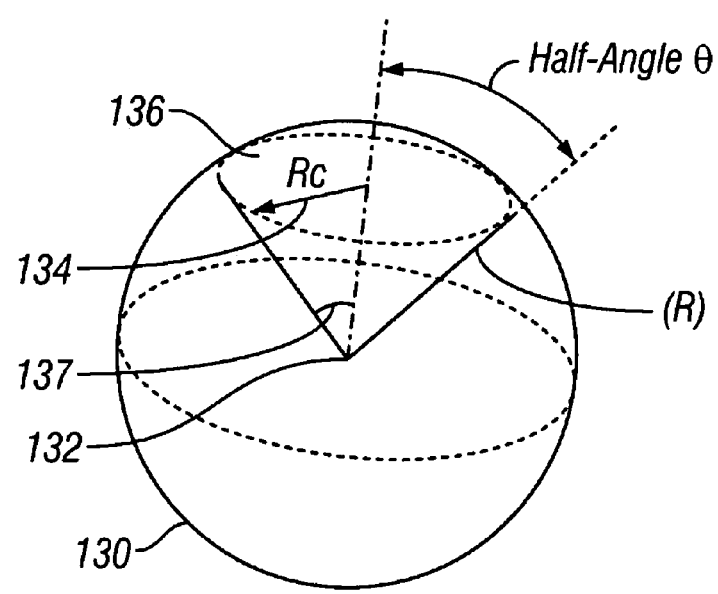
FIG. 5 is a diagrammatic representation of one embodiment for estimating effective solid angle.

Turning to FIG. 5, assume a sphere 130 of given radius (R) surrounds point source 132 (in this example, point source 132 approximates a Lambertian source at a significant distance). The projected area of a hemisphere of the sphere is πR$^2$ and the projected area of the full sphere is 2πR$^2$. This model can be used to design a LED because an interface between a quantum well region and a substrate can be modeled as a Lambertian emitter such that from any point on a hypothetical hemisphere centered over the interface, a given point on the interface will have the same radiance. The area $A_3$ can be calculated as the flat, circular surface (e.g., surface 136) that is subtended by the beam solid angle of interest using a radius of the circle 134 ($R_c$) that is the distance from the normal ray to the intersection of the spherical surface. For a given half angle 137 of θ of the beam, $R_c$ is the product of R (the radius of the sphere) and the sine of the angle θ, such that $$R_c = R*\mathrm{Sin}(\theta) \hspace{2cm} [\mathrm{EQN.\ 3}]$$

The area equals:

$$A_3 = \pi R_c^2 = \pi(R*\mathrm{Sin}(\theta))^2 \quad \text{[EQN. 4A]}$$

The area $A_3$ is the projected area of the solid angle as it intersects the sphere. The area $A_3$ is divided by the projected area of the hemisphere ($A_h = \pi R^2$) and the quotient is multiplied by the projected solid angle of the full hemisphere (equal to $\pi$) to obtain the projected solid angle $\Omega$, such that:

$$\Omega = \pi * \left\{ \begin{array}{c} \text{projected area of} \\ \text{desired solid angle} \end{array} \right\} / \left( \begin{array}{c} \text{projected area} \\ \text{of hemisphere} \end{array} \right) \quad \text{[EQN. 4B]}$$

$$\Omega = (\pi) * [\{\pi(R*\mathrm{Sin}(\theta))^2\}/(\pi R^2)] \quad \text{[EQN. 4C]}$$

$$= \pi * \mathrm{Sin}^2(\theta) \quad \text{[EQN. 5]}$$

For interface 50 of FIG. 1, for example, $\theta$ is 90 degrees, leading to a projected solid angle of $\pi*\mathrm{Sin}^2(90) = \pi$, and for the desired half angle of 30 degrees, the projected solid angle is $\pi*\mathrm{Sin}^2(30) = \pi/4$. Using these values for $\Omega_1$ and $\Omega_2$ for EQN. 1, $A_2$ can be determined for any half angle.

In the above example, the solid angle is determined using equations derived from a Lambertian source modeled as a point source. These equations do not consider the fact that light may enter a substrate from a quantum well region through an interface that may be square, rectangular, circular, oval or otherwise shaped. While the above-described method can give a good estimate of the solid angle, which can be later adjusted if necessary based on empirical or computer simulation testing, other methods of determining the effective solid angle can be used.

Figure 6A:
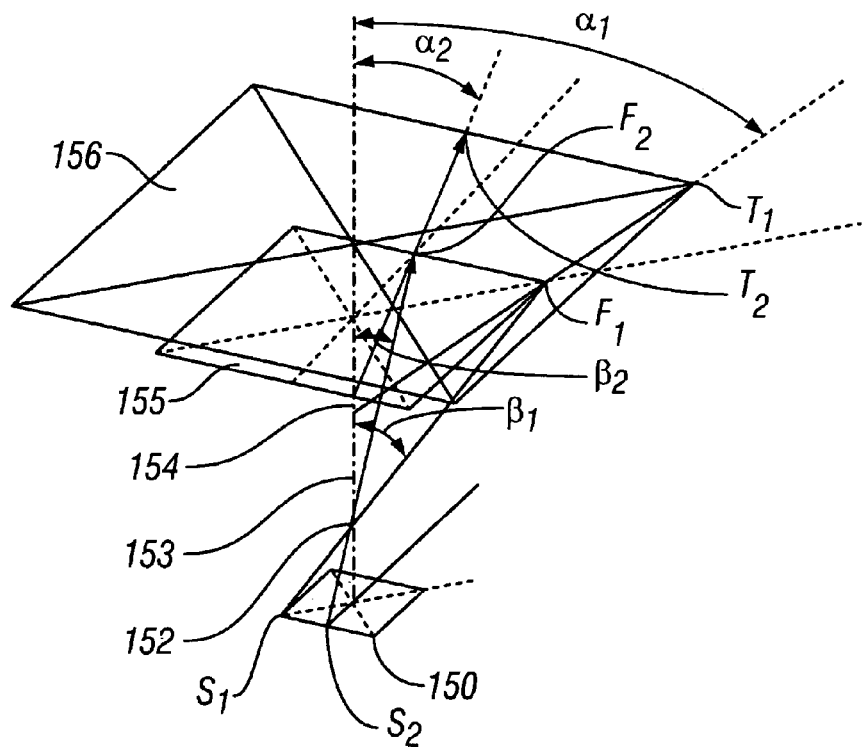
FIGS. 6A-6E are diagrammatic representations describing another embodiment for estimating effective solid angle.

FIGS. 6A-6E describe another method for determining the effective solid angle for a substrate of an LED. FIG. 6A is a diagrammatic representation of one embodiment of an interface 150 and an exit face 155 of a shaped substrate 160 (shown in FIG. 6B) and a hypothetical target plane 156 onto which light is projected. FIG. 6A illustrates examples for a position of an effective source origin 152, central normal 153 and effective output origin 154. For purposes of further discussion, it is assumed that the center of interface 150 is at 0,0,0 in a Cartesian coordinate system. Target plane 156 represents the parameters of the resulting pattern (e.g., size and half angle used by other optics). According to one embodiment, the half angle at the diagonal (shown as $\alpha_1$ in FIG. 6B) is the starting point. For example, if the desired light at target plane 156 has a maximum half angle of 30 degrees, $\alpha_1$, for a square- or rectangular-faced substrate is 30 degrees. The half-angle within shaped substrate 160 (labeled $\beta_1$ and also shown in FIG. 6C) can then be determined according to:

$$n_2 \mathrm{Sin}(\alpha_1) = n_1 \mathrm{Sin}(\beta_1) \quad \text{[EQN. 6]}$$

where $n_1$ is the IOR of shaped substrate 160;
$n_2$ is the IOR of the material (typically air) into which the light is projected from shaped substrate 160;
$\alpha_1$ is the half angle at the exit face in the medium external to the substrate (typically air);
$\beta_1$ is the desired half angle in the substrate.

Figure 6B:
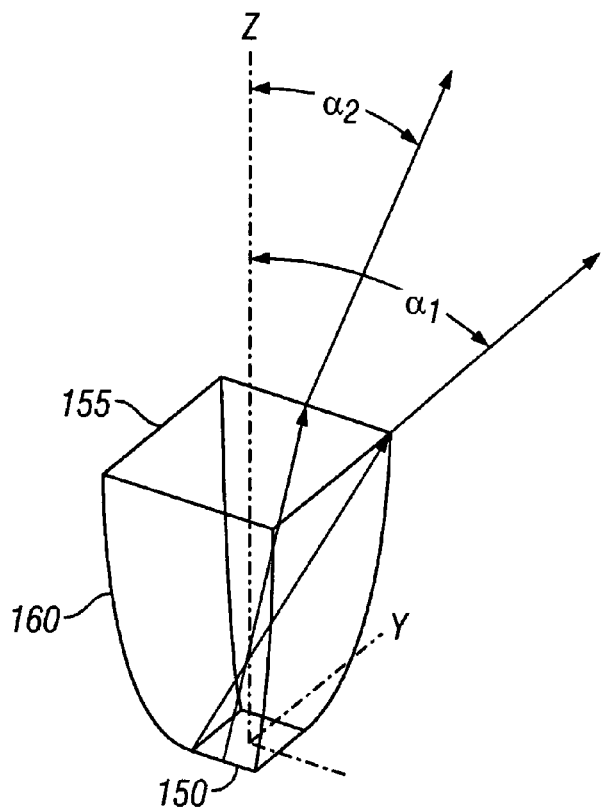
Figure 6C:
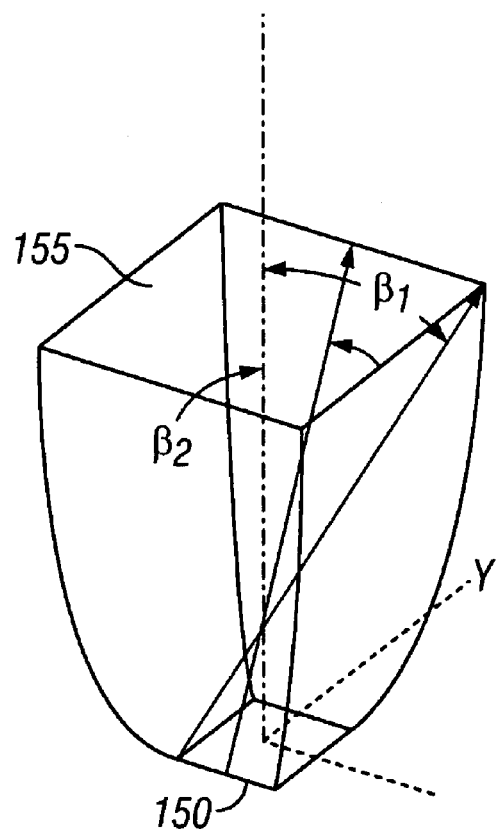

For example, if the desired half-angle $\alpha_1$ is 30 degrees, and a shaped substrate having an IOR of 1.77 is projecting into air having an IOR of 1, then $\beta_1 = 16.41$ degrees. A similar calculation can be performed for a ray projecting from a point on the long and short sides of entrance face 150. For example, as shown in FIGS. 6B and 6C, $\alpha_2$ and $\beta_2$ can be determined for a ray traveling from the center of one edge on interface 150 to the center of the opposite edge of exit face 155. (The critical angle is the same at 16.41, but $\beta_1$ is not the same as $\beta_2$. $\beta_2$ is determined by the geometry of the sides and the height of the shaped substrate.)

Using the angles calculated, the location of an effective point source can be determined. For a square interface 150, of length $l_1$, the effective point source will be located X=0, Y=0 and $$Z_{eps} = \frac{l_1}{\sqrt{2} * \tan(\beta_1)} \quad \text{[EQN. 7]}$$

Where Zeps is the distance the effective point source is displaced from entrance face 150 of shaped substrate 160.

The X, Y and Z distances from the effective point source to points $F_1$ and $F_2$ can be calculated assuming $F_1$ intersects a sphere of unity radius according to:

$$X_{F1} = \cos(\psi_1)\sin(\beta_1) \quad \text{[EQN. 8]}$$

$$Y_{F1} = \sin(\psi_1)\sin(\beta_1) \quad \text{[EQN. 9]}$$

$$Z_{F1} = \cos(\beta_1) \quad \text{[EQN. 10]}$$

$$X_{F2} = 0 \quad \text{[EQN. 11]}$$

$$Y_{F2} = \cos(\psi_2)*\sin(\beta_1) \quad \text{[EQN. 12]}$$

$$Z_{F2} = \cos(\beta_1) \quad \text{[EQN. 13]}$$

where $\psi_1$ is the angle of the diagonal ray in the X-Y plane (45 degrees for a square) and where $\psi_2 = 90$ degrees for a ray projecting from the middle of a side parallel to the X axis as shown in FIG. 6C. As shown in FIG. 6A, because 156 intersects the spherical surface at four points and the magnitude of angle $\beta_2$ is less than the magnitude of critical angle $\beta_1$, the values for point $F_2$ are calculated based on the projection of a diagonal with an angle $\beta_1$ onto the plane of the side ray. A similar methodology based on the geometries previously calculated can be used to determine other points (e.g., for example, the location of points $T_1$ and $T_2$ can be determined based on the location of points $F_1$ and $F_2$ and the desired half angle of light at target plane 156.)

Figure 6D:
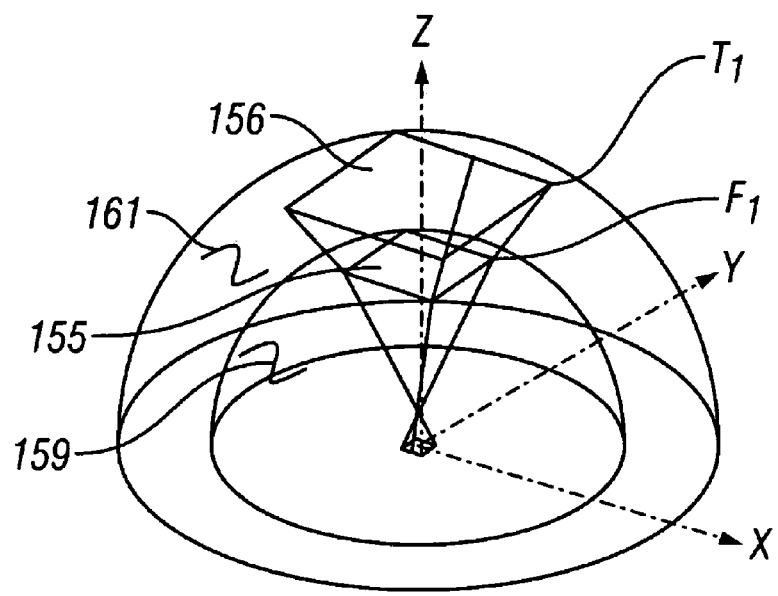
Figure 6E:
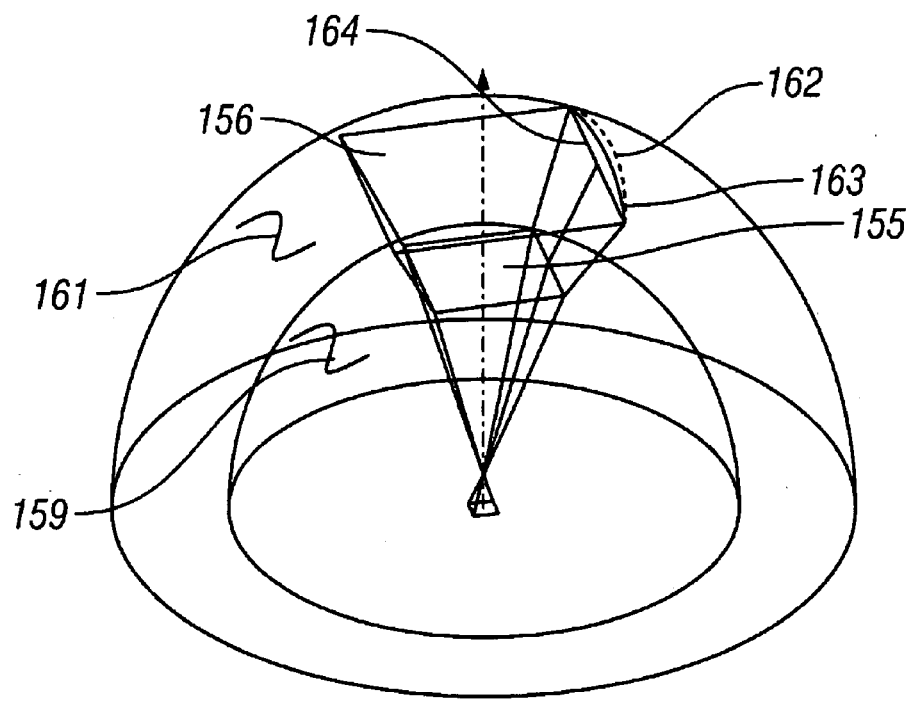

FIG. 6D illustrates the diagonal rays and one ray from the short side projected onto a sphere 159 for exit face 155 and sphere 161 for target plane 156. For exit face 155, the projection of the intersection of the edge rays at the sphere 159 onto the plane of the exit face 155, forms elliptical segments. Likewise, the projection of the refracted exit rays at the edge of the target face intersect the sphere 161. FIG. 6E, for example, points out the circular intersection of the rays lying in the plane formed by the edge 163 of target face 156 intersecting sphere 161 (shown at 162), and the projection of that intersection onto the target plane 156 (shown at 164). By calculating the area of each of the elliptical segments surrounding the square of the target face and adding that to the area of the target face, we find the total projected area of the target face. The effective solid angle can be determined for the target plane using EQN. 4B Similarly, by using sphere 159 and the elliptical segments formed thereon by rays, the effective solid angle for the LED can be determined. For example, the total projected area is determined as described above and inserted as "projected area of desired solid angle" in EQN. 4B.

As one illustrative example, using the above method to project light with a half-angle of 30 degrees using a LED having a substrate with a square shaped interface and exit face yields an effective solid angle of 0.552 steradians to the target in air. By contrast, the use of the traditional circular projected area with a 30 degree half angle projection specification would yield an effective solid angle of 0.785 steradians. When these values are then used in EQN. 1, for given IORs and flux, the traditional (circular) calculation yields a required exit area that is undersized by about 30%. If one were to design a system using this approach, the applicable physics (i.e. the conservation of radiance) would reduce the light output by 30% over the optimum design. Conversely, using the corrected effective solid angle described above calculates an exit face area that will produce 42% more light output than is achievable with the circular calculation.

Although particular methods of determining the effective solid angle for a LED are described above, any method known or developed in the art can be used. Alternatively, the minimum surface area to conserve light can be determined empirically. Moreover, while the minimum surface area calculations above assume light is entering the substrate across the entire surface of the interface between the quantum well region and the substrate, in physical devices, light may not enter the substrate in an even distribution across the entire surface of the interface. The calculations of the minimum area of the exit face can be adjusted to account for the actual distribution of light traversing the interface, rather than being based entirely on the size of the area of the interface. In one embodiment, the actual area of the interface through which light enters the substrate can be used as $A_1$.

Embodiments of LEDs can project light into a desired cone angle of 10-60 degrees with a theoretical efficiency of up to 89% (meaning that 89% of the light entering the substrate is emitted in the desired half-angles with 11% fresnel loss) depending on substrate material and Fresnel losses. The efficiency can be 100% without fresnel losses. Even at only 70% efficiency, embodiments of LEDs provide greater efficiency than other LED technologies, while also allowing for uniform or near uniform intensity distributions at both near and far fields.

Fresnel losses at the substrate to air (or other medium) interface can be overcome by the application of anti-reflective coatings to the exit face of the substrate. Anti-reflective coatings that can be used are any that would be known to one of ordinary skill in the art and include single layer MgO or MgF, multilayer coating or other anti-reflective coatings. Through the utilization of anti-reflective coatings, Fresnel losses can be reduced or eliminated, increasing the light output efficiency of a LED.

Figure 7:
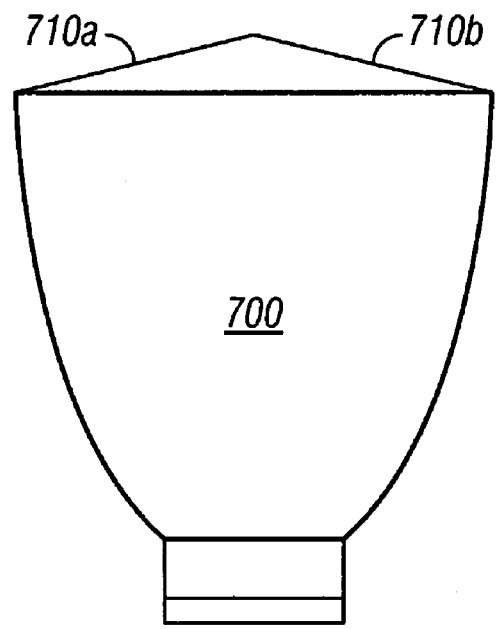
FIG. 7 is a diagrammatic representation of one embodiment of a LED.

An embodiment of a LED may have more than one exit face. For example, a shaped substrate may allow substantially all the light generated by the LED to exit the LED, but through more than a single exit face. FIG. 7 is a diagrammatic representation of an example of a LED 700 with more than one exit face. In FIG. 7, exit faces 710a and 710b of LED 700 are shown. A LED having more than one exit face might emit light into a solid angle greater than a hemisphere. To maximize the light exiting the exit faces, the sidewalls of a substrate with more than a single exit face may have multiple curved or faceted surfaces.

For a LED with two or more exit faces, it is possible for the solid angle of emission of the LED to be greater than a hemisphere (and the projected solid angle to be greater than pi). An example of this would be if instead of a single planar exit face, the LED had a four sided pyramidal set of exit faces. If the sidewalls of the substrate of the LED are shaped to direct light entering the substrate through the interface to one of the four exit faces so as to strike the exit face at an angle not greater than the critical angle, then all the light entering the substrate may exit the LED through one of the four exit faces.

Since the faces of the pyramid are not in a plane, but rather are at angles to each other, any ray that strikes an exit face at the critical angle to that exit face will refract to an exit angle of 90 degrees. The total solid angular space defined this way would then be a function of the angular relationship of the four exit faces. To satisfy the etendue equation, the four exit faces in this example would have to have a total surface area at least equal to the calculated value using the effective solid angle for that construction.

This multi-exit face construction may still be constructed in such a way as to conserve radiance. That is, by making the total projected exit face area equal to the calculated value, and by designing the sidewalls to provide uniform distribution of the light to each portion of the exit faces, radiance can be conserved. If the exit faces are made larger than the required value, then light entering the substrate may exit through the exit faces, with a corresponding reduction in luminous intensity.

A further embodiment of a shaped substrate with multiple exit faces is one in which the sidewalls of the shaped substrate are themselves exit faces. Depending on a point of entrance of a given light ray, it may strike a given sidewall at an angle not greater than the critical angle, and pass through that sidewall, or it may strike at an angle greater than the critical angle and be internally reflected to another face or sidewall.

If the sidewall exit faces and sidewalls are designed such that any ray entering the substrate from any point on the interface passes through a sidewall exit face, then all of the light entering the substrate will exit the substrate.

Shaped substrate LEDs with multiple exit faces may be appropriate for use in general lighting applications where broad area emission is desired. Such LEDs may be used in conjunction with additional lens or reflector elements that will direct light produced by the LED into a smaller solid angle.

The potential benefit of a shaped substrate with multiple exit faces or in which sidewalls act as exit faces is that the LED may have a smaller volume or may have a shape that is more readily manufactured—such as planar faces instead of curved surfaces.

Figure 8A:
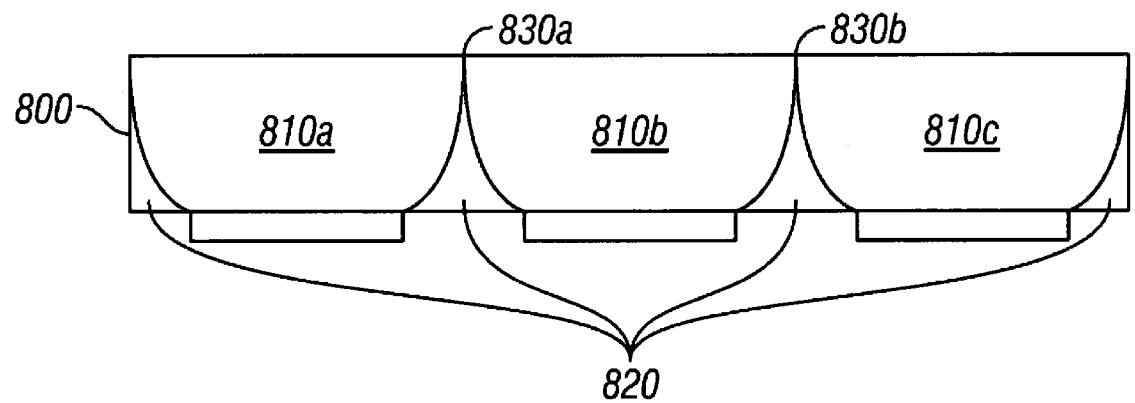
FIG. 8A-8B are diagrammatic representations of embodiments of an array of LEDs.
Figure 8B:
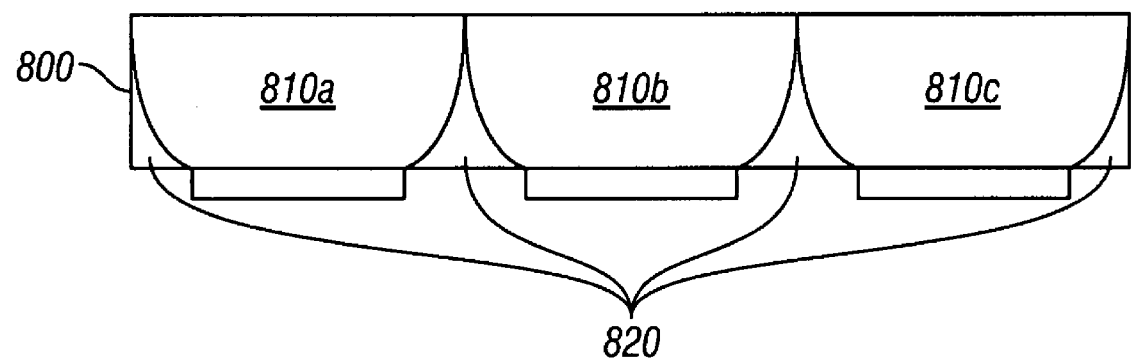

LEDs can be arranged in an array of LEDs. An array of LEDs can be used to produce a desired amount of light and a desired light pattern. For example, LEDs may be arranged in a square or other shape. Using an array of LEDs to produce the desired amount of light may be more efficient or may consume less space than using a single LED. An array of LEDs can be formed during manufacture. For example, an array of LEDs can be formed from the same wafer. In FIG. 8A, LED array 800 comprises LEDs 810a-810c that are formed from the same wafer. Wafer material 820 is removed to form LEDs 810a-810c. LED 810a remains attached to LED 810b at point 830a. Likewise, LED 810b remains attached to LED 810c at point 830b. Thus, through the selective removal of substrate material, arrays of LEDs may be formed. FIG. 8 represents one method of forming arrays of LEDs and is illustrative and not limiting: other methods for forming arrays of LEDs as would be known to one skilled in the art are within the scope of the invention.

One advantage of using an array of LEDs is that the shaped substrates of the multiple LEDs in the array may be thinner than the shaped substrate for a single LED having the same amount of light output. Additionally, an array of smaller LEDs may be more efficient than a single LED; that is, an array of smaller LEDs that consume a certain amount of input power may produce more light than a single large LED of the same exit face size and input power.

Figure 9A:
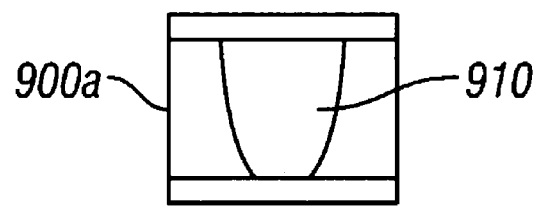
FIGS. 9A-9C are diagrammatic representations of embodiments of retaining devices.
Figure 9B:
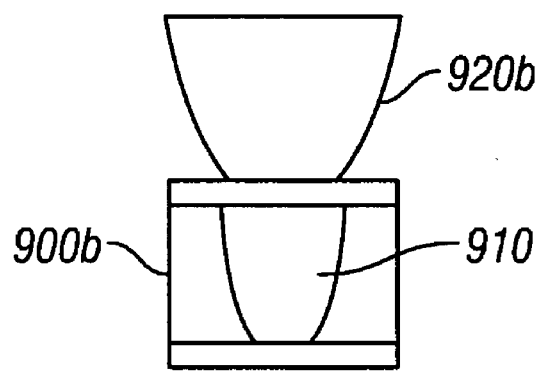
Figure 9C:
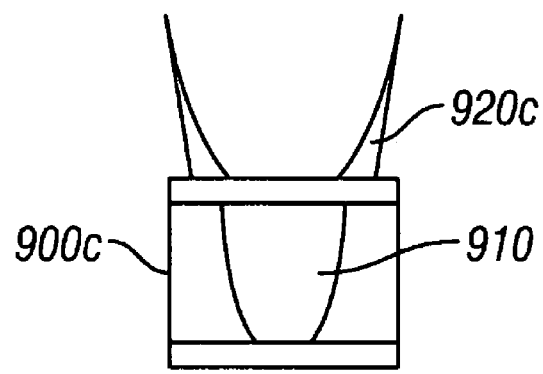

Because some embodiments of LEDs may utilize thicker substrates than traditional LEDs, a retaining device can be used to secure a LED within an LED package. A mechanical attachment device (e.g., of molded plastic, metal or other material) can secure an LED or LEDs within an LED package or other structure and contact an LED to create a normal force to keep the LED in place. Sideways motion can be prevented by frictional force between the attachment device and the LED. The device may have the same IOR as the substrate so that rays exiting the substrate are not deviated as they pass through the attachment device. The attachment device can include secondary optics such as a lens, layer of material or other face through which light exiting the substrate passes. Consequently, the attachment device can additionally act to shape or further define the output beam. FIGS. 9A-9C are diagrammatic representations of various examples of retaining devices 900a-900c that can be used to secure LED 910. Retaining device 900b of FIG. 9B includes a lens 920b that can further focus light from LED 910. Retaining device 900c of FIG. 9C includes a reflective focusing device 920c that can further focus light from LED 910. In one embodiment, reflective focusing device 920c is a compound parabolic concentrator.

One or more methods may be used to shape or form a LED or the substrate of a LED. The methods of shaping a substrate as described below are exemplary and comprise a subset of the numerous methods available. The methods described below and other methods used in the LED or optics industries may be used to produce LEDs. Methods that can be used, alone or in combination, to shape a LED or a substrate by removing material include etching, laser ablation, water jet cutting, ultrasonic removal, and mechanical removal.

Etching describes a chemical process of removing substrate material in a highly controlled manner as to yield the appropriate shape. There are typically two types of etching methods: wet etching and dry etching. Wet etching involves using liquid-phase etchants to remove the substrate material. In dry etching, plasma etching and reactive ion etching, ions are created and imparted onto the substrate. There, either based on chemical reaction or particle momentum, material is removed from the substrate.

Starting with a wafer of substrate material (that may further include material comprising the quantum well region), a particular pattern of photoresist can be deposited on a side of the wafer. The wafer is then etched. Locations on the wafer covered with the photoresist would not be etched, whereas places without the photoresist would have material removed. There are many ways to tune the process to achieve the desired contour at the edge of the photoresist. For example, thicker layers of photoresist can be applied and then sacrificially removed during the etching process, or other sacrificial layers can be used in conjunction with the photoresist. These layers are removed over time by the etchant in such a manner as to produce the desired contour of the LED substrate. This can be exploited to accurately etch the wafer so as to produce shaped substrates. Another way is to use multiple resists and multiple etching steps. Each photoresist and etch step can be used to remove a small layer of material. Multiple small steps can be use get the desired 3D shape.

Figure 10:
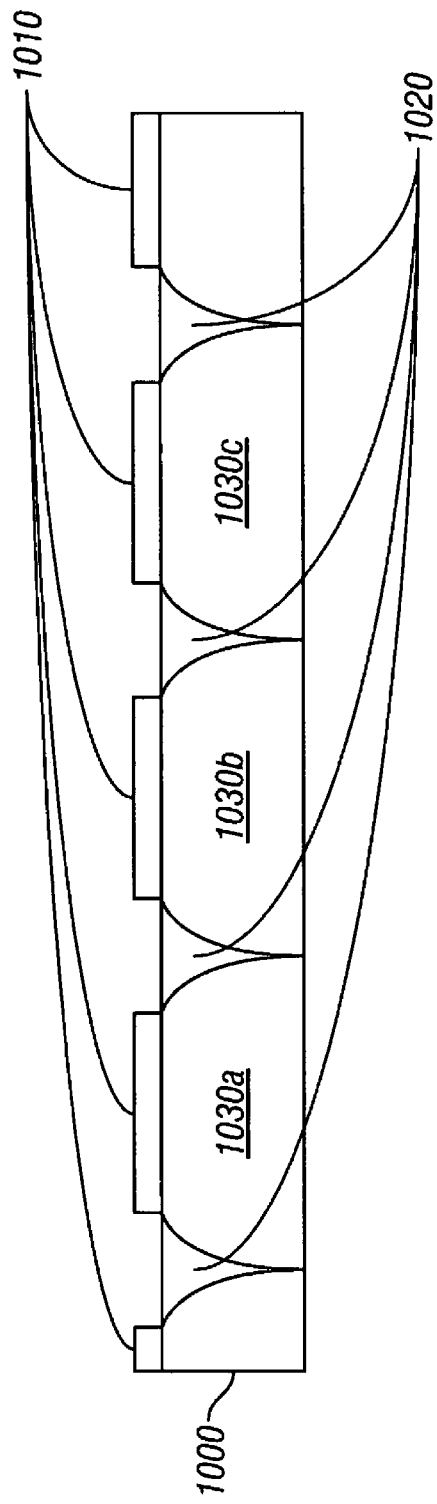
FIG. 10 is a functional representation of an embodiment of etching.

FIG. 10 is a diagrammatic representation of an example of etching. In FIG. 10, wafer 1000 is etched to form shaped substrates 1030a-1030c. Photoresist 1010 is applied to a surface of wafer 1000 in a desired pattern such that portions of the surface of wafer 1000 are covered with photoresist 1010. Subsequent to the application of photoresist 1010, an etchant is applied to the same surface of wafer 1000 that the photoresist was applied. The etchant removes substrate material 1020, forming shaped substrates 1030a-1030c. Photoresist and etchant can be applied in successive layers and patterns to achieve a desired sidewall shape.

Etching parameters may be based on the substrate material. The etch rate varies depending on the etchant and the substrate. For substrate materials used in LED applications such as sapphire and silicon carbide, the etch rates using reactive ion etching can range from 250 nm to 2.5 um per min, which may be slow for commercial production purposes. Silicon carbide is on the upper end of the above etch rate while sapphire is on the lower end.

Laser ablation is the process of using a high power laser to produce LEDs by removing or ejecting quantum well region or substrate material. Each laser pulse will only remove a minute amount of material. The laser can be translated to remove material with each subsequent pulse. By translating in the X-Y and Z directions, a 3D shape can be removed. Embodiments of laser ablation can be used to shape substrates faster than etching. Using known techniques, laser ablation can remove around 500 um to 1 mm in thickness per minute in silicon carbide and sapphire.

Figure 11:
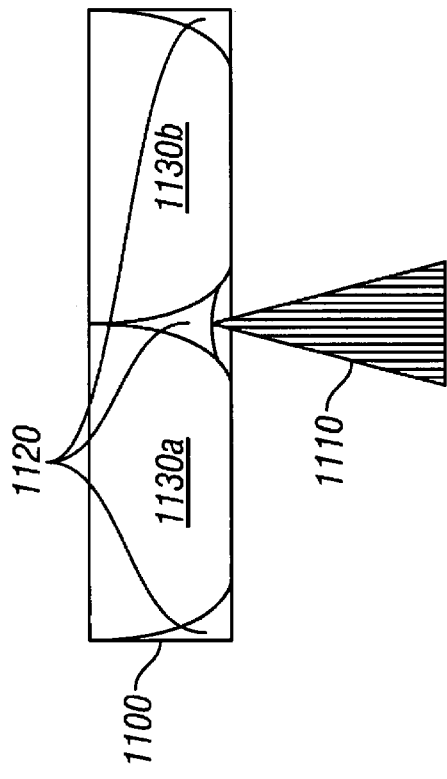
FIG. 11 is a functional representation of an embodiment of laser ablation.

FIG. 11 is a diagrammatic representation of laser ablation. Laser 1110 is applied to wafer 1100 to ablate substrate material 1120, forming shaped substrates 1130a-1130b.

A water jet may be used to ablate a wafer to form a substrate of the desired shape. In one embodiment of water jet ablation, short pulses of water can be used to ablate a wafer in stages. The process by which pulses of water are used to ablate a wafer may be similar to the process described above in regard to laser ablation. In one embodiment of water jet ablation, the water jet can be used to cut completely through the wafer at a certain angle, then the angle shifted slightly and the water jet used to cut through the wafer at a slightly higher angle, eventually producing a substrate of the desired shape. In a further embodiment, the water jet may be charged with abrasive material (e.g. industrial diamond particles) to increase the rate at which material is ablated.

Another option is to mechanically remove material through grinding, milling, sawing, ultrasonic grinding, polishing, drilling, or other systems or methods of mechanical removal. There are numerous methods for removing material to shape one or more LEDs through mechanical removal. For example, a sawing blade (typically, a diamond grinding wheel) can be used to dice the wafer into multiple LEDs or substrates. The saw blade is prepped to have the inverse shape of one or more sidewalls, taking into account minor material losses that will occur to the blade during the removal process (i.e., the blade may begin slightly oversized). The blade is then used to saw the wafer. The rotation of the saw blade may polish the substrate sidewalls as it cuts. Each cut forms the sidewalls of adjacent substrates. According to one embodiment, the saw will first make multiple cuts in one-axis and then make cuts orthogonally to that axis to form the shaped substrates. The mechanical removal of material may be done in stages.

Figure 12A:
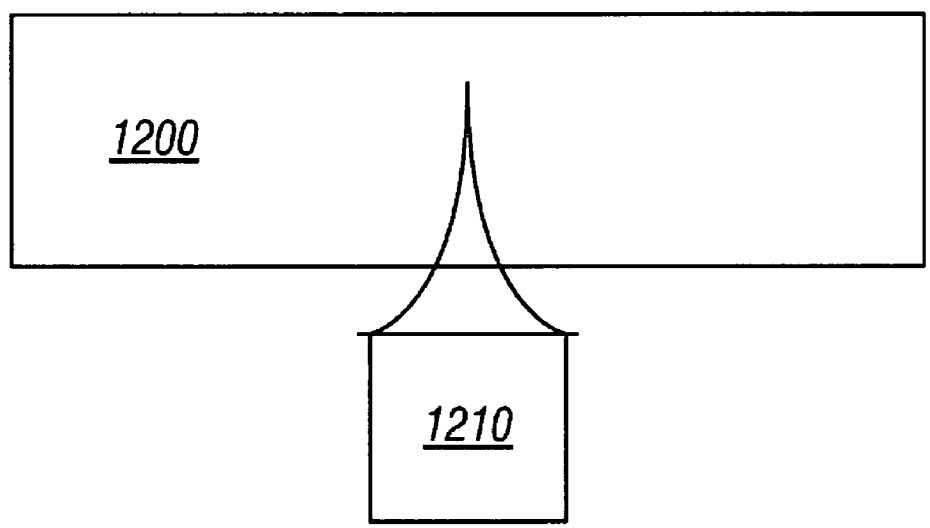
FIGS. 12A-12B are functional representation of an embodiment of sawing.
Figure 12B:
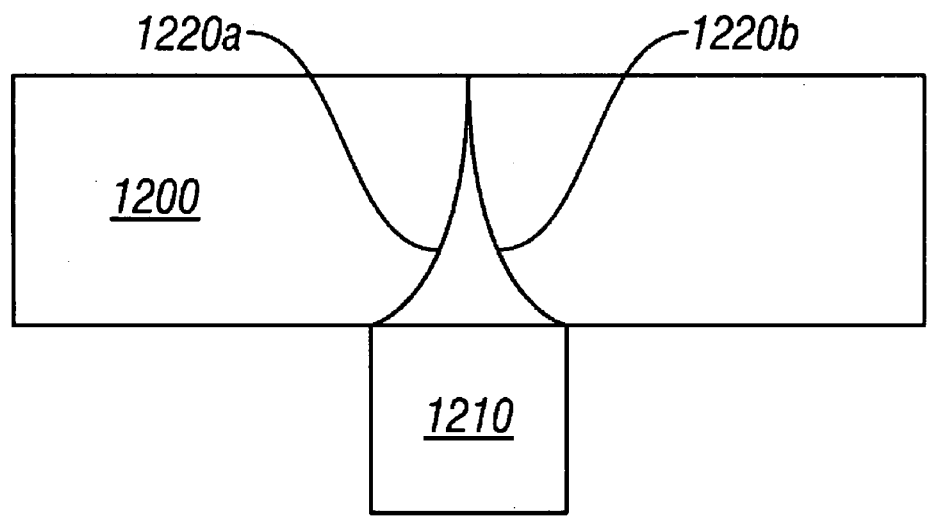
Figure 13A:
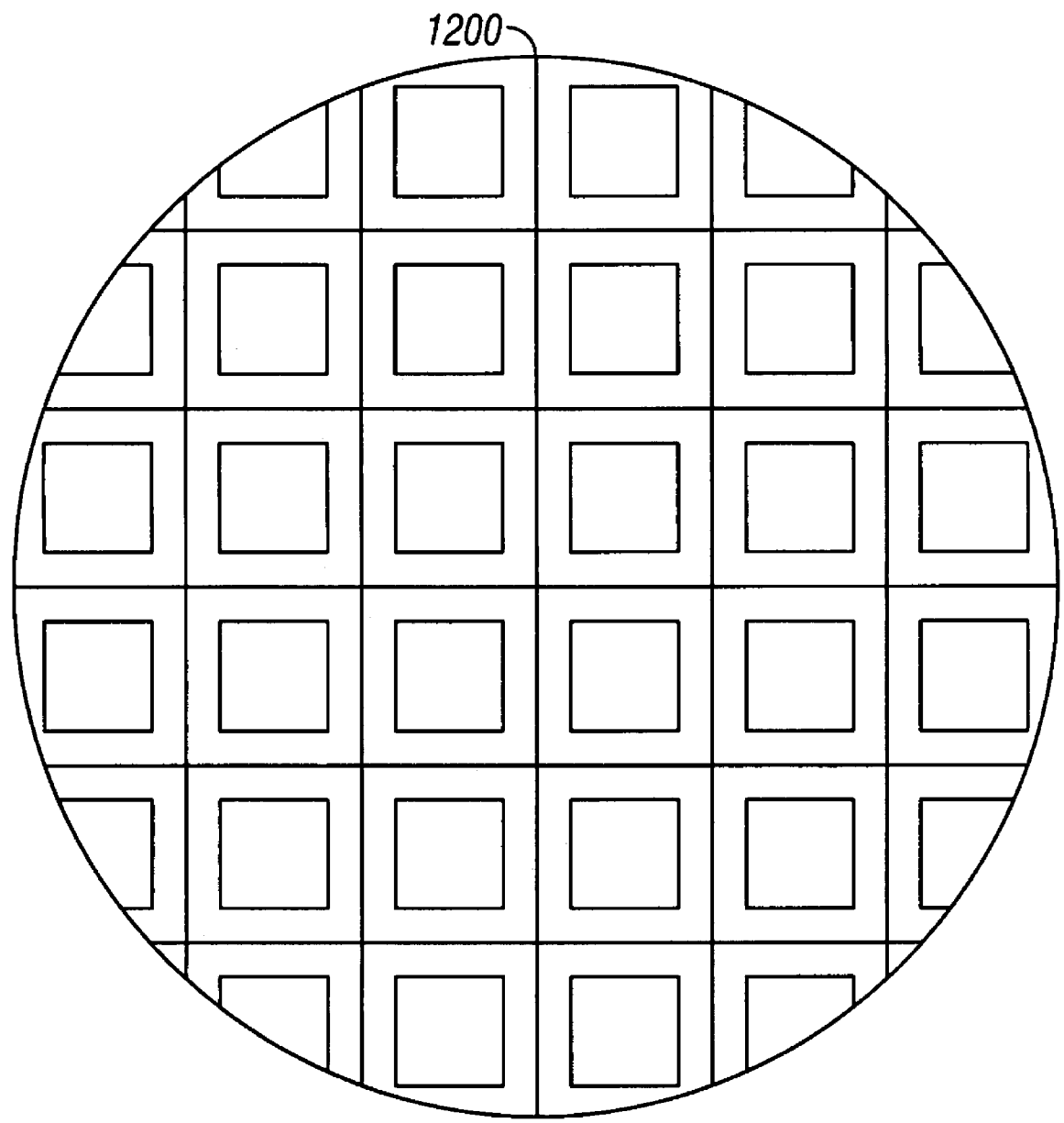
FIGS. 13A-13B are diagrammatic representations of an embodiment of a wafer having had substrates shaped through sawing.
Figure 13B:
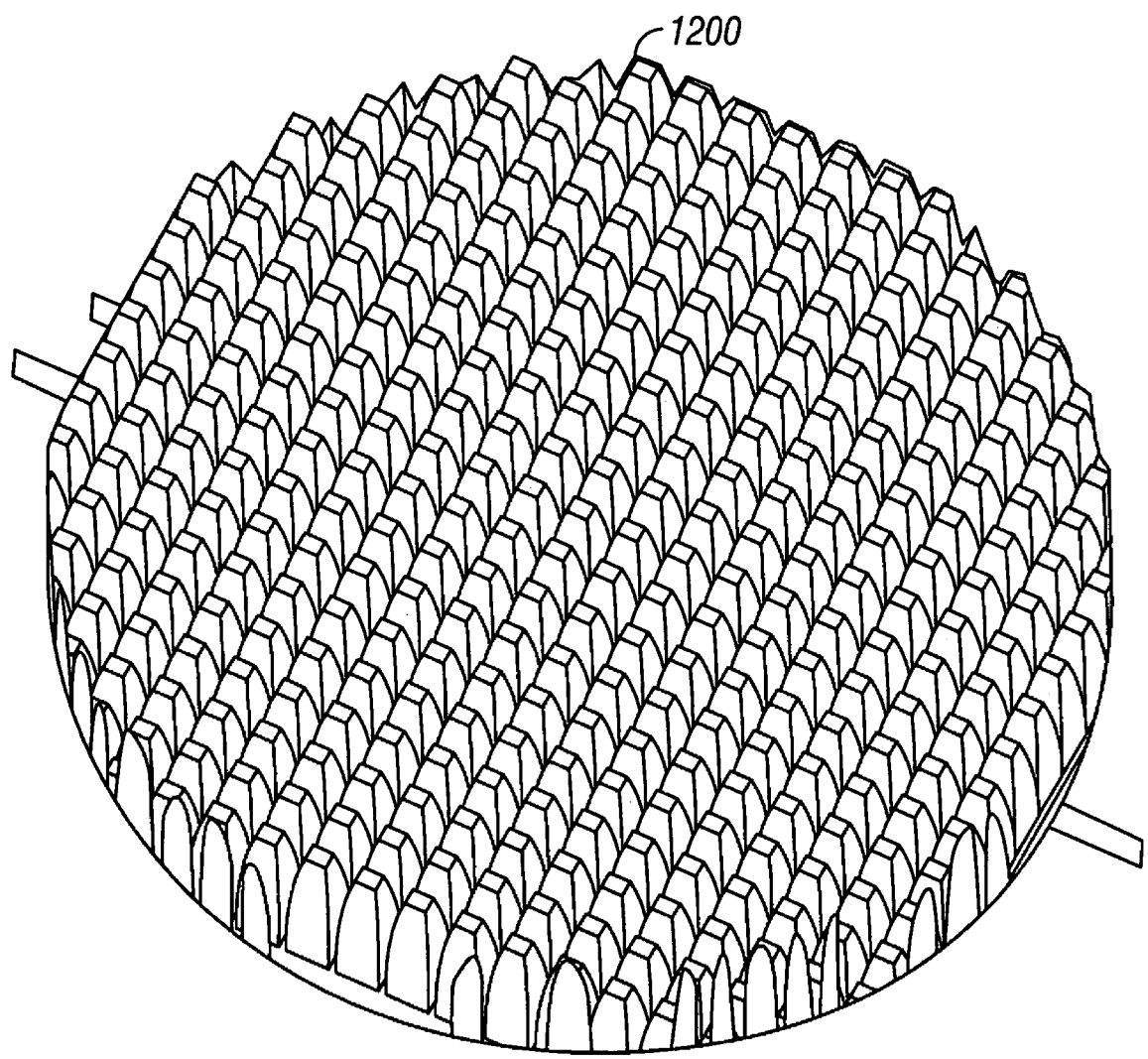

FIGS. 12A-12B are diagrammatic representations of forming a LED utilizing a sawing blade. In FIG. 12A, a sawing blade 1210 having the inverse shape of a desired sidewall of a shaped substrate is applied to wafer 1200. FIG. 12B shows sawing blade 1210 when fully impacted into wafer 1200, forming sidewalls 1220a and 1220b. FIGS. 13A and 13B are diagrammatic representations of top views of wafer 1200 subsequent to the application of sawing blade 1210 to wafer 1200. Subsequent to the mechanical removal of substrate material, the shaped substrate may be polished to enhance TIR within the shaped substrate.

While the above methods of ablating a wafer of material to form shaped substrates have been described individually, the above methods may be combined. For example, it may be possible to use a combination of mechanical removal and water jet ablation to ensure an appropriately curved sidewall shape. Similarly, various other combinations of methods and techniques for removing substrate material from a wafer to produce LEDs can be used as appropriate depending on the substrate material. In addition, other methods, such as ultrasonic machining can be used to form shaped substrates. Ultrasonic grinding may also be used to shape substrates. In embodiments of ultrasonic grinding, a tool with the inverse shape of one or more LEDs is primed with an abrasive and brought into contact with the substrate material while the tool is ultrasonically vibrated to produce a scrubbing/scuffing action on the substrate material such that material is removed and shaped substrates are produced.

While the above embodiments describe forming LEDs from a wafer of material, shaped substrates utilized to produce LEDs can be formed from a bar of substrate material or may be shaped from substrate material individually.

In one embodiment of a LED, LEDs may be individually produced. For example, an individual shaped substrate may be mounted in a receiving tool such that it is accurately located. The sidewalls may be protected by protectors such as resist materials, shielding structures in the receiving tool or other protectors. The desired epitaxial layers may be deposited on the base of the shaped substrate, thus producing a LED. By way of further example, the individual shaped substrate may be made of a moldable material such as high temperature glass. The glass shaped substrate may then be developed into a LED by depositing the desired epitaxial layers on the base using low temperature epitaxial growth methods.

Figure 14:
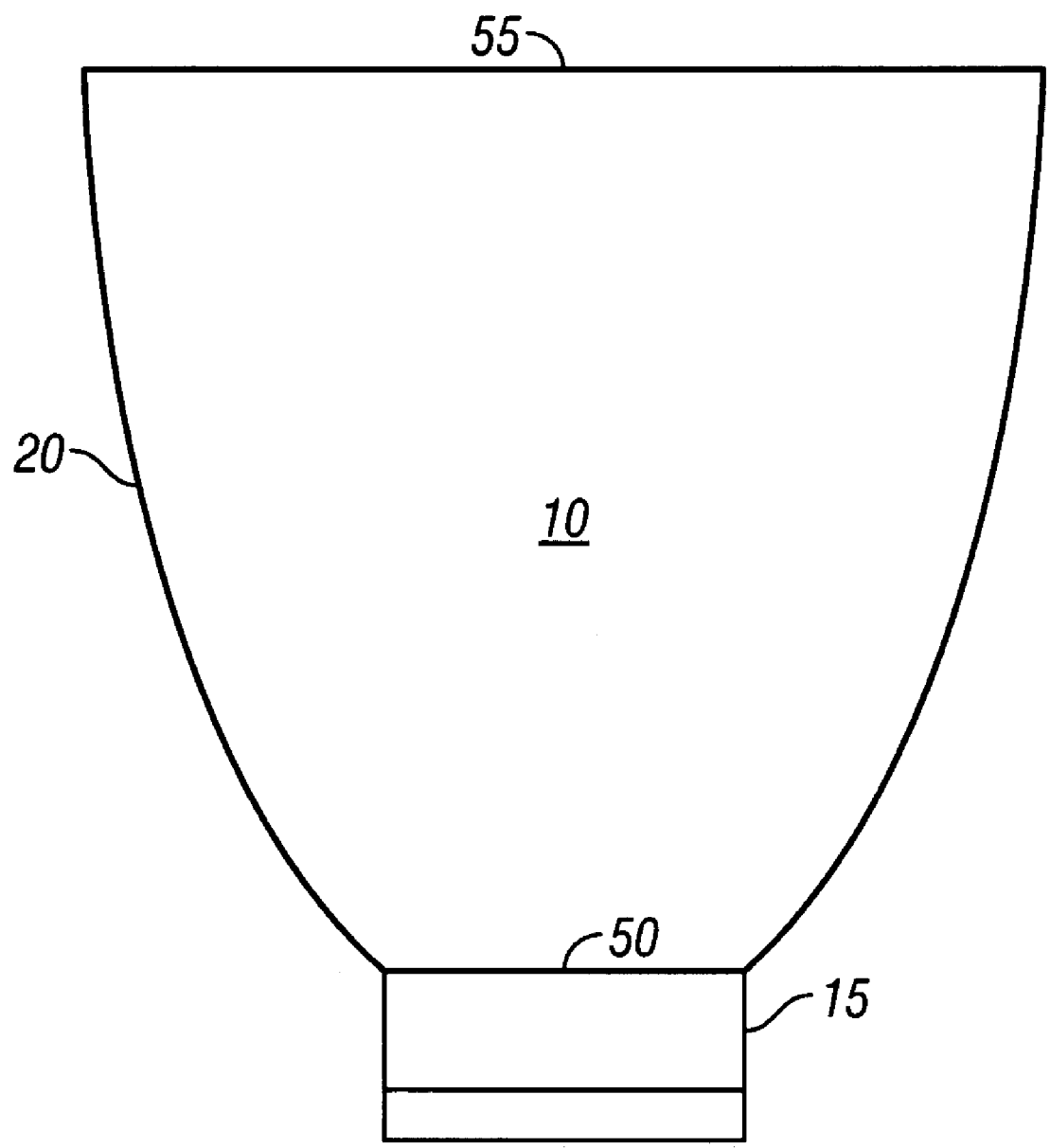
FIG. 14 is a diagrammatic representation of one embodiment of a LED.

In some cases, it may be desired to generate white light using a LED. This can be accomplished by impinging light from a single-color (e.g. blue), short wavelength LED onto phosphors or other particles that absorb the light and re-emit light in a wavelength that the human eye perceives as white light. Phosphors or other particles can be used with embodiments of LEDs to produce white light. FIG. 14 shows one embodiment of LED 20. Phosphors or other particles can be placed at interface 50 between quantum well region 15 and substrate 10. In such a case, the light entering substrate 10 would be white light as seen by the human eye. Phosphors can also be placed subsequent to exit face 55 of substrate 10. According to one embodiment, a layer of particles can coat exit face 55. According to other embodiments, particles can be on another piece of material that contacts the exit face or that is offset from the exit face. For example, phosphors can be on an interior face of a lens that encapsulates, but does not contact, exit face 55 of LED 20.

Coating the exit face or faces of a LED may have fabrication advantages that may allow for the simplification of white light LED fabrication, which may in turn reduce the cost of white light LED fabrication. For example, a side of a wafer out of which shaped substrate LEDs will be formed may be coated with a layer containing phosphors or other particles (i.e. a particle coating) that can be excited to emit white light. The side of the wafer that has not been coated with the particle coating can be ablated. When the wafer has been ablated to produce multiple LEDs, the LEDs will have an exit face having the particle coating necessary to produce white light. Furthermore, because a shaped substrate directs a supermajority of light entering the substrate to a known exit face or faces, coating a particular exit face or faces may be highly effective in the generation of white light. Accordingly, the use of a shaped substrate may eliminate the need to coat the sidewalls or a portion of the sidewalls of an LED with a particle coating. Thus, there will be no need to individually apply a particle coating to each LED. Applying a particle coating to a side of a wafer may be cheaper than applying a particle coating to individual LEDs. The sidewalls of the substrate can be designed so that light scattered back into the substrate by interactions with the particle coating may be partially or fully recycled. Utilizing nano-particles to generate white light in conjunction with a LED allows for minimum deflection of light, thus minimizing backscattered light and maximizing the light emitted from the exit face.

Heat generated in the quantum well region of LEDs causes the degradation of phosphor particles or nano-particles. In current LEDs, phosphors conformally coat the LED chip. The thermal density is highest at the chip, and therefore phosphors are subject to tremendous heat. In embodiments of an LED with a shaped substrate having a phosphor coating on the exit face, because the exit face is removed from the heat generating quantum well region by the height of the substrate, the degradation of the phosphors is reduced. Thus, an LED with a thick substrate and consequently an exit face removed from the quantum well region may generate white light of a desired quality longer than existing designs.

Potential applications for embodiments of LEDs include cell phone display lighting. Present systems typically use three side-emitting blue LEDs with phosphor-filled encapsulant material to generate white light. The sides of the LED are typically opaque and a large percentage of the light generated is absorbed by the sidewalls. This results in over 50% of the light being lost to absorption. In addition, the index change at the interface of the encapsulant to air creates a TIR condition for exit rays striking the interface at greater than the critical angle. This results in approximately 44% loss at the interface. Embodiments of shaped substrate LEDs, can deliver 80% of the generated light to the light guide, resulting in very large system brightness improvements.

Another potential application for embodiments of LEDs is use as a cell phone camera flash. Present systems typically use LEDs with Gaussian energy distributions that produce a very bright area in the center of the image and dark areas at the edges, causing uneven lighting of the subject matter. Moreover, the beam shape of present flash units is circular, while the image captured by the CCD camera is rectangular. Additionally, the index of refraction change at the interface of the encapsulant to air creates a TIR condition for exit rays striking the interface at greater than the critical angle. This results in losses at the interface that are a function of the exit solid angle. Embodiments of LEDs, on the other hand, can deliver a rectangular or square flash, with 80% of the light entering the substrate of the LED being provided to the image area in a uniform distribution. This results in more uniform scene illumination and higher levels of illumination as opposed to prior art LED flash systems.

Another potential application for embodiments of LEDs is for liquid crystal display ("LCD") backlighting. Traditional LCD systems use a linear array of red, green and blue LEDs. The light from the LEDs is directed into a mixing light guide to provide uniformity of color and intensity. Typically, the LEDs have a dome placed over the LED and light is captured by elliptical reflectors to direct the light to the light guide. While elliptical reflectors work well for point sources, LEDs are not point sources and some of the rays will not get to the focii inside the light guide. Moreover, since some light from a dome encapsulant is emitted at greater than 180 degrees, some of the light is absorbed by the substrate, PCB board and other components. Furthermore, because the dome is large with respect to the size of the cavity in the dome, a certain percentage of light typically gets refracted. Because these losses are multiplicative, only a percentage of the light originally emitted from the LED actually gets to the light guide.

Embodiments of LEDs, on the other hand, can provide up to 80% of the light entering the substrate of the LED to the light guide (assuming Fresnel losses) in the desired cone angle. Consequently, lower power LEDs can be used to achieve the same results as are possible in current systems or more light can be delivered at the same power consumption level. Indeed, in some embodiments, the light guide may not be required and arrays of LEDs may be used to directly backlight LCDs.

Another potential use for embodiments of LEDs is in car headlights, flashlights, digital light processing ("DLP") systems and other devices. The shape of the LED can be selected so as to provide the desired projection cone and beam profile. Furthermore, the combination of a LED and a condenser lens or other optical device, such as the Primary Optic Device ("POD") described in U.S. patent application Ser. No. 11/649,018, entitled "SEPARATE OPTICAL DEVICE FOR DIRECTING LIGHT FROM AN LED", allows for the emission of a narrow solid angle (on the order of 0.1 steradians or less) while conserving radiance and doing so in a very small volume. Such a combination is applicable for flashlights, spot lights or any other narrow beam application.

In U.S. patent application Ser. No. 11/649,018, entitled "SEPARATE OPTICAL DEVICE FOR DIRECTING LIGHT FROM AN LED", a Primary Optic Device ("POD") is described. Embodiments of systems and methods described herein differ from and provide significant advantages over the POD device. The POD device is a passive optic element used in conjunction with LEDs to focus light emitted from the LED. The POD device itself is unable to generate light and directs light generated by other sources. The POD is typically made of materials having an IOR of approximately 1.5. Thus, the amount of light that can enter the POD device from an LED is limited by the change in IOR from the LED material to the POD device material. By contrast, this disclosure regards a LED that itself collects and directs the light generated in its own quantum wells. All of the light in the substrate of the LED can theoretically be captured and directed. If the substrate material has a higher IOR than or equal IOR to the IOR of the quantum well region material, then all of the light generated by the quantum wells of the LED may be captured and directed. With the POD device, this may not be possible. Shaping an LED to capture and direct the light generated by the quantum wells of the LED itself results in a single LED that may be used in many applications without the need for additional optic components.

Figure 15A:
FIGS. 15A and 15B are diagrammatic representations of another embodiment of a wafer.
Figure 15B:
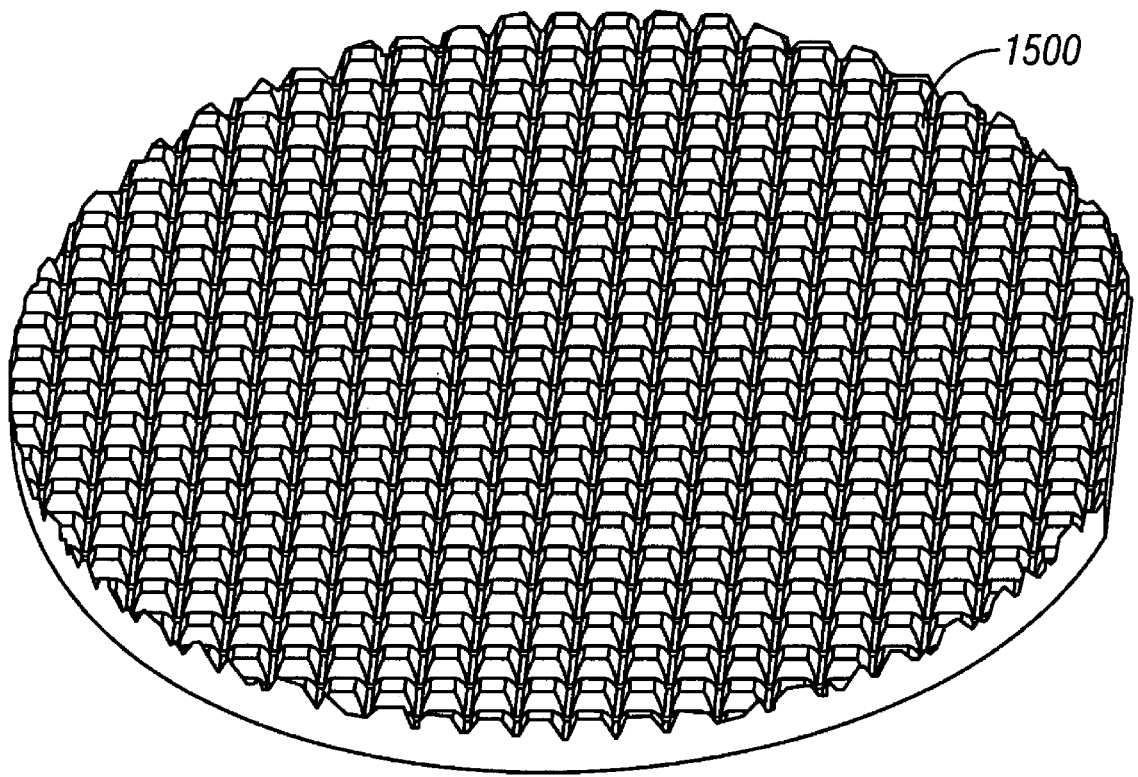

FIGS. 15A and 15B are a diagrammatic representations of another embodiment of a layout of multiple die being made in a single wafer 1500. In this case, the die are packed more closely together and the sidewall shape is formed by any of the methods already described, except the depth of cut of the sidewall is greatly reduced. For example for a 3 mm thick wafer in the previous embodiment, the sidewall shape would be cut 2.75 mm deep with 0.25 mm remaining to hold all the die together. In the example of FIG. 15, the depth of cut is only about 1 mm, leaving about 2 mm to hold the die together. This creates a much stronger wafer for handling in manufacturing, and allows the die to packed more closely together. This results in more die per wafer on the order of 1.5 to 2.4 times as many die per wafer. After all the operations are completed on the wafer, the die are separated for example by diamond sawing them with a thin sawblade (on the order of 0.1 mm wide. The surface produced by the sawblade may closely approximate the intended sidewall shape in that region, and may provide an adequately polished surface, such that no further operations are needed. Alternatively, subsequent operations may be performed to finish shaping and polishing that portion of the sidewalls, on the individual die.

While this disclosure describes particular embodiments, it should be understood that the embodiments are illustrative and that the scope of the invention is not limited to these embodiments. Many variations, modifications, additions and improvements to the embodiments described above are possible. For example, the various ranges and dimensions provided are provided by way of example and LEDs may be operable within other ranges using other dimensions. By way of example, while shaped substrates have been described in regard to sapphire and silicon carbide, other substrates that allow the passage of light may be used. For example, substrates may be made of glass or diamond. In one embodiment, substrates may be molded from moldable glass, providing a cost effective and easily shaped substrate. It is contemplated that these variations, modifications, additions and improvements fall within the scope of the invention as detailed in the following claims.

What is claimed is:

1. A method of manufacturing an LED comprising:
determining a size of an exit face of a shaped substrate portion of the LED so that the exit face has at least 70% of a minimum area necessary to conserve radiance for a desired half-angle of light projected from the LED;
determining a distance between the exit face and an interface between the shaped substrate portion and a quantum well region of the LED;
determining shapes and positions of a set of sidewalls of the shaped substrate portion of the LED so that each sidewall is positioned and shaped to cause at least a majority of rays having a straight transmission path from the interface to that sidewall to reflect through total internal reflection to the exit face with an angle of incidence at the exit face at less than or equal to a critical angle at the exit face; and
forming the shaped substrate portion of the LED in accordance with the determined size of the exit face, shapes and positions of the set of sidewalls and distance between the exit face and the interface; wherein the method is performed by performing steps in the order of:
(a) determining boundary conditions for the shaped substrate portion of the LED, wherein the boundary conditions comprise the size of the exit face of the shaped substrate portion of the LED and the distance between the exit face and the interface between the shaped substrate portion and the quantum well region of the LED;
(b) the determining the shapes and positions of the set of sidewalls of the shaped substrate portion of the LED; and
(c) the forming the shaped substrate portion of the LED.

2. The method of claim 1, depositing one or more layers on the shaped substrate portion to form the quantum well region of the LED after the shaped substrate portion has been formed.

3. The method of claim 1, further comprising:
providing a substrate and one or more layers for a quantum well region of the LED;
removing material from the substrate to form the shaped substrate portion of the LED.

4. The method of claim 3, wherein removing material from the substrate further comprises removing material using one of an ultrasonic removal process; laser ablation or water jet cutting.

5. The method of claim 3, wherein removing material from the substrate further comprises cutting or grinding the substrate with a blade having an inverse shape to a desired shape of the shaped substrate portion of the LED.

6. The method of claim 3, wherein removing material from the substrate further comprises etching the substrate.

7. The method of claim 3, further comprising coating the substrate with a photo-luminescent layer prior to removing material from the substrate.

8. The method of claim 1, further comprising shaping the quantum well region of the LED in conjunction with shaping the substrate.

9. The method of claim 1, wherein the LED is shaped to achieve a desired light output profile.

10. The method of claim 1, wherein the size of the exit face is selected to have at least the minimum area necessary to conserve radiance.

11. A method of shaping an LED comprising:
providing a wafer comprising a substrate and one or more layers for a quantum well region of the LED;
grinding the substrate to form a shaped substrate portion of the LED;
wherein the shaped substrate portion is shaped to comprise:
an exit face opposite from and a distance from an interface with the to receive light generated by a quantum well region of the LED, the exit face having a size being at least 70% of a minimum area necessary to conserve radiance for a desired half-angle of light projected from the shaped substrate; and
a set of sidewalls, wherein each sidewall is positioned and shaped so that at least a majority of rays having a straight transmission path from the interface to that sidewall reflect through total internal reflection to the exit face with an angle of incidence at the exit face of less than or equal to a critical angle at the exit face;
wherein the method is performed by performing steps in the order of:
(a) determining boundary conditions for the shaped substrate portion of the LED, wherein the boundary conditions comprise the size of the exit face of the shaped substrate portion of the LED and the distance between the exit face and the interface between the shaped substrate portion and the quantum well region of the LED;
(b) determining the shapes and positions of the set of sidewalls of the shaped substrate portion of the LED; and
(c) shaping the shaped substrate portion of the LED.

12. The method of claim 11, wherein grinding the substrate comprises grinding the substrate with a shaped diamond grinding wheel.

13. The method of claim 11, wherein grinding the substrate comprises:
making multiple cuts in the substrate along a first axis at least part way through the wafer; and
making multiple cuts in the substrate along a second axis at least part way through the wafer at an angle to the first axis to create shaped substrate portions for multiple LEDs.

14. The method of claim 11, further comprising shaping the quantum well region of the LED in conjunction with shaping the substrate.

15. The method of claim 11, wherein the LED is shaped to achieve a desired light output profile.

16. The method of claim 11, wherein the exit face has the minimum area necessary to conserve radiance.

17. A method of shaping an LED comprising:
providing a wafer comprising a substrate and one or more layers for a quantum well region of the LED;
etching the substrate to form a shaped substrate portion of the LED;
wherein the shaped substrate portion of the LED is shaped to comprise:
an exit face opposite and at a distance from an interface to receive light generated by a quantum well region of the LED, the exit face having at least 70% of a minimum area necessary to conserve radiance for a desired half-angle of light projected from the shaped substrate portion of the LED; and
a set of sidewalls, wherein each sidewall is positioned and shaped so that at least a majority of rays having a straight transmission path from the interface to that sidewall reflect through total internal reflection to the exit face with an angle of incidence at the exit face of less than or equal to a critical angle at the exit face;
wherein the method is performed by performing steps in the order of:
(a) determining boundary conditions for the shaped substrate portion of the LED, wherein the boundary conditions comprise the size of the exit face of the shaped substrate portion of the LED and the distance between the exit face and the interface between the shaped substrate portion and the quantum well region of the LED;
(b) determining the shapes and positions of the set of sidewalls of the shaped substrate portion of the LED; and
(c) shaping the shaped substrate portion of the LED.

18. The method of claim 17, wherein etching the substrate further comprises dry etching the substrate.

19. The method of claim 17, wherein etching the substrate further comprises wet etching the substrate.

20. The method of claim 17, wherein etching the substrate further comprises etching the substrate using a multiple etch resist etching process.

21. The method of claim 17, further comprising shaping the quantum well region of the LED in conjunction with shaping the substrate.

22. The method of claim 17, wherein the LED is shaped to achieve a desired light output profile.

23. The method of claim 17, wherein the exit face is shaped to have at least the minimum area necessary to conserve radiance.

24. A method of manufacturing an LED comprising:
providing a substrate and one or more layers for a quantum well region of the LED;
removing material from the substrate to form a shaped substrate portion of the LED, the shaped substrate portion comprising:
two or more exit faces having a size such that a combined area of the two or more exit faces being at least 70% of a minimum area necessary to conserve radiance for a desired half-angle of light projected from the LED; and
a set of sidewalls, wherein each sidewall is positioned and shaped so that at least a majority of rays having a straight transmission path from an interface to that sidewall reflect through total internal reflection to an exit face of the two or more exit faces with an angle of incidence at that exit face of less than or equal to a critical angle at that exit face; wherein the method is performed by performing steps in the order of:

(a) determining boundary conditions for the shaped substrate portion of the LED, wherein the boundary conditions comprise the size of the two or more exit faces of the shaped substrate portion of the LED and the distance between the two or more exit faces and the interface between the shaped substrate portion and the quantum well region of the LED;

(b) determining the shapes and positions of the set of sidewalls of the shaped substrate portion of the LED; and (c) shaping the substrate portion of the LED.

25. The method of claim 24, wherein the two or more exit faces have an area that is at least the minimum area necessary to conserve radiance.

* * * * *